United States Patent
Yota et al.

(10) Patent No.: US 11,804,460 B2
(45) Date of Patent: *Oct. 31, 2023

(54) DEVICES AND METHODS RELATED TO STACK STRUCTURES INCLUDING PASSIVATION LAYERS FOR DISTRIBUTING COMPRESSIVE FORCE

(71) Applicant: SKYWORKS SOLUTIONS, INC., Irvine, CA (US)

(72) Inventors: Jiro Yota, Westlake Village, CA (US); Dogan Gunes, North Andover, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/676,602

(22) Filed: Feb. 21, 2022

(65) Prior Publication Data

US 2022/0336396 A1    Oct. 20, 2022

Related U.S. Application Data

(63) Continuation of application No. 14/838,822, filed on Aug. 28, 2015, now Pat. No. 11,257,774.

(Continued)

(51) Int. Cl.
*H01L 23/00* (2006.01)
*H01L 23/31* (2006.01)
*H01L 23/10* (2006.01)

(52) U.S. Cl.
CPC .............. *H01L 24/11* (2013.01); *H01L 23/10* (2013.01); *H01L 23/3192* (2013.01);
(Continued)

(58) Field of Classification Search
CPC ......... H01L 24/11; H01L 24/03; H01L 24/05; H01L 24/13; H01L 2224/0391; H01L 2224/0401; H01L 2924/35121
(Continued)

(56) References Cited

U.S. PATENT DOCUMENTS 7,034,402 B1    4/2006 Seshan
2003/0183407 A1   10/2003 Ma et al.
(Continued)

FOREIGN PATENT DOCUMENTS

CN    1455955    11/2003
CN    101083239    12/2007
(Continued)

OTHER PUBLICATIONS 201510548477.8, Improved Stack Structures in Electronic Devices, filed Aug. 31, 2015.
(Continued)

*Primary Examiner* — Nduka E Ojeh
*Assistant Examiner* — Laura M Dykes
(74) *Attorney, Agent, or Firm* — Chang & Hale LLP

(57) ABSTRACT

Structures, methods and devices are disclosed, related to improved stack structures in electronic devices. In some embodiments, a stack structure includes a pad implemented on a substrate, the pad including a polymer layer having a side that forms an interface with another layer of the pad, the pad further including an upper metal layer over the interface, the upper metal layer having an upper surface. In some embodiments, the stack structure also includes a passivation layer implemented over the upper metal layer, the passivation layer including a pattern configured to provide a compressive force on the upper metal layer to thereby reduce the
(Continued)

likelihood of delamination at the interface, the pattern defining a plurality of openings to expose the upper surface of the upper metal layer.

20 Claims, 14 Drawing Sheets

Related U.S. Application Data

(60) Provisional application No. 62/044,302, filed on Aug. 31, 2014.

(52) U.S. Cl.
CPC .............. *H01L 24/03* (2013.01); *H01L 24/05* (2013.01); *H01L 24/13* (2013.01); *H01L 24/29* (2013.01); H01L 23/3114 (2013.01); H01L 24/16 (2013.01); H01L 24/32 (2013.01); H01L 24/94 (2013.01); H01L 2224/0215 (2013.01); H01L 2224/02125 (2013.01); H01L 2224/0391 (2013.01); H01L 2224/0401 (2013.01); H01L 2224/04026 (2013.01); H01L 2224/05005 (2013.01); H01L 2224/0508 (2013.01); H01L 2224/0509 (2013.01); H01L 2224/05011 (2013.01); H01L 2224/05012 (2013.01); H01L 2224/05018 (2013.01); H01L 2224/05022 (2013.01); H01L 2224/05078 (2013.01); H01L 2224/05083 (2013.01); H01L 2224/05084 (2013.01); H01L 2224/05088 (2013.01); H01L 2224/05093 (2013.01); H01L 2224/05096 (2013.01); H01L 2224/05098 (2013.01); H01L 2224/05558 (2013.01); H01L 2224/11 (2013.01); H01L 2224/131 (2013.01); H01L 2224/13022 (2013.01); H01L 2224/13082 (2013.01); H01L 2224/16227 (2013.01); H01L 2224/291 (2013.01); H01L 2224/29011 (2013.01); H01L 2224/29022 (2013.01); H01L 2224/29082 (2013.01); H01L 2224/32225 (2013.01); H01L 2224/81191 (2013.01); H01L 2224/81193 (2013.01); H01L 2224/94 (2013.01); H01L 2924/12 (2013.01); H01L 2924/1421 (2013.01); H01L 2924/1461 (2013.01); H01L 2924/163 (2013.01); H01L 2924/35121 (2013.01)

(58) Field of Classification Search
USPC ........................................................ 257/738
See application file for complete search history.

(56) References Cited

U.S. PATENT DOCUMENTS

| | | | |
|---|---|---|---|
| 2003/0214007 A1 | 11/2003 | Tao et al. | |
| 2003/0218259 A1 | 11/2003 | Chesire et al. | |
| 2004/0188786 A1 | 9/2004 | Bar-Sadeh et al. | |
| 2005/0014356 A1 | 1/2005 | Pozder et al. | |
| 2006/0289961 A1* | 12/2006 | Shindo | H01L 27/088 257/E27.06 |
| 2007/0075423 A1* | 4/2007 | Ke | H01L 24/05 257/737 |
| 2008/0001290 A1 | 1/2008 | Chou et al. | |
| 2008/0006951 A1 | 1/2008 | Hebert et al. | |
| 2008/0303177 A1 | 12/2008 | Wu et al. | |
| 2009/0079070 A1* | 3/2009 | Lin | H05K 3/3452 257/E23.141 |
| 2009/0256257 A1* | 10/2009 | Daubenspeck | H01L 24/13 257/E23.141 |
| 2010/0006989 A1 | 1/2010 | Dalal et al. | |
| 2011/0049723 A1* | 3/2011 | Fayaz | H01L 21/76801 257/E21.59 |
| 2011/0316153 A1* | 12/2011 | Nagai | H01L 24/03 257/737 |
| 2012/0061823 A1 | 3/2012 | Wu et al. | |
| 2012/0112343 A1* | 5/2012 | Jain | H01L 24/05 257/737 |
| 2012/0205812 A1* | 8/2012 | Sutardja | H01L 23/485 257/773 |
| 2013/0140691 A1* | 6/2013 | Bao | H01L 24/05 257/737 |

FOREIGN PATENT DOCUMENTS

| | | |
|---|---|---|
| CN | 102693922 | 9/2012 |
| CN | 103035599 | 4/2013 |
| CN | 103579008 | 2/2014 |
| CN | 103579166 | 2/2014 |
| CN | 103779234 | 5/2014 |

OTHER PUBLICATIONS 16104514.1, Improved Stack Structures in Electronic Devices, filed Apr. 20, 2016.
104128697, Improved Stack Structures in Electronic Devices, filed Aug. 31, 2015.
108129474, Improved Stack Structures in Electronic Devices, filed Aug. 19, 2019.

* cited by examiner

DEVICES AND METHODS RELATED TO STACK STRUCTURES INCLUDING PASSIVATION LAYERS FOR DISTRIBUTING COMPRESSIVE FORCE

CROSS-REFERENCE TO RELATED APPLICATION(S)

This application is a continuation of U.S. patent application Ser. No. 14/838,822, filed Aug. 28, 2015, entitled "STACK STRUCTURES IN ELECTRONIC DEVICES INCLUDING PASSIVATION LAYERS FOR DISTRIBUTING COMPRESSIVE FORCE," which claims priority to U.S. Provisional Application No. 62/044,302, filed Aug. 31, 2014, entitled "IMPROVED STACK STRUCTURES IN ELECTRONIC DEVICES," the disclosure of each of which is hereby expressly incorporated by reference herein in its entirety.

BACKGROUND

The present disclosure relates to bonding stack structures for particular semiconductor packaging applications.

DESCRIPTION OF THE RELATED ART

Some semiconductor chip packages use metallic bumps to allow for electrical connections to other devices. These bumps are formed over openings in a protective layer over a respective semiconductor chip.

SUMMARY

In accordance with some implementations, the present disclosure relates to a stack structure including a pad implemented on a substrate, the pad including a polymer layer having a side that forms an interface with another layer of the pad, the pad further including an upper metal layer over the interface, the upper metal layer having an upper surface. The stack structure also includes a passivation layer implemented over the upper metal layer, the passivation layer including a pattern configured to provide a compressive force on the upper metal layer to thereby reduce the likelihood of delamination at the interface, the pattern defining a plurality of openings to expose the upper surface of the upper metal layer.

In some embodiments, the stack structure further includes a metal structure implemented over the pad such that the metal structure is connected to the exposed upper surface of the upper metal layer through the plurality of openings of the passivation layer. In some implementations, the other layer of the pad is a metal layer such that the interface is between the polymer layer and the metal layer. In some embodiments, the metal layer is below the upper metal layer, and in some implementations, the upper metal layer is the metal layer forming the interface with the polymer layer.

In some embodiments, the polymer layer of the stack structure has a tensile film stress property, and in some implementations the polymer layer includes polyimide, benzocyclobutene (BCB), or polybenzoxazole (PBO). In some embodiments, the passivation layer of the stack structure includes a silicon nitride layer.

In some embodiments, the pattern defining the plurality of openings of the passivation layer, is configured to function as a strap or a net over the upper metal layer to thereby provide the compressive force on the upper metal layer. In some embodiments, the strap or the net of the pattern is substantially contiguous around the plurality of openings.

In some implementations, the substrate is a semiconductor substrate, and in some embodiments, the semiconductor substrate is a flip-chip substrate. In some embodiments, the pad of the stack structure is a bump pad and the metal structure is a metal bump. In some implementations, the semiconductor substrate is a base wafer layer having an integrated circuit (IC), and in some embodiments, the stack structure is configured to form a ring on the base wafer layer, the ring defining an inner area dimensioned to accommodate a device, the ring further configured to allow mounting of a cap wafer to substantially enclose the inner area.

The present disclosure also relates to a method for fabricating a stack structure. The method includes providing a substrate, forming a pad on the substrate such that the pad includes a polymer layer having a side that forms an interface with another layer of the pad, the pad further including an upper metal layer over the interface, the upper metal layer having an upper surface, forming a passivation layer over the upper metal layer, and patterning the passivation layer to yield a plurality of openings to expose the upper surface of the upper metal layer, and to provide a compressive force on the upper metal layer to thereby reduce the likelihood of delamination at the interface.

In some implementations, the method further comprises forming a metal structure over the pad such that the metal structure is connected to the exposed upper surface of the upper metal layer through the plurality of openings of the passivation layer.

According to some implementations, a chip is disclosed, having a substrate layer. The chip also includes a plurality of connection structures implemented on a surface of the substrate layer, each connection structure including a pad, where the pad includes a polymer layer having a side that forms an interface with another layer of the pad, the pad further including an upper metal layer over the interface, the upper metal layer having an upper surface, the connection structure further including a passivation layer implemented over the upper metal layer, the passivation layer including a pattern configured to provide a compressive force on the upper metal layer to thereby reduce the likelihood of delamination at the interface, the pattern defining a plurality of openings to expose the upper surface of the upper metal layer, the connection structure further including a metal structure implemented over the pad such that the metal structure is connected to the exposed upper surface of the upper metal layer through the plurality of openings of the passivation layer.

In some embodiments, the chip is a flip-chip, and in some embodiments, the chip is a MEMS device. In some embodiments, the chip is an integrated passive device (IPD). In some implementations, the substrate layer includes a semiconductor die, while in some implementations, the semiconductor die includes an integrated circuit (IC), and in some implementations, the IC is configured to provide radio-frequency (RF) functionality.

In some embodiments, the substrate layer of the chip includes a semi-insulating layer, and in some embodiments, the semi-insulating layer includes a passive circuit. In some embodiments, the semi-insulating layer includes gallium arsenide (GaAs). In some embodiments, the substrate layer of the chip includes an insulator layer, and in some embodiments, the insulator layer includes glass or sapphire.

The present disclosure also relates to a method for fabricating a flip-chip. The method includes providing a semiconductor die having an integrated circuit (IC), and forming a plurality of connection structures on a surface of the die such that each connection structure includes a pad, the pad including a polymer layer having a side that forms an interface with another layer of the pad, the pad further including an upper metal layer over the interface, where the upper metal layer has an upper surface. The method further includes forming a passivation layer over the upper metal layer, patterning the passivation layer to yield a plurality of openings to expose the upper surface of the upper metal layer and to provide a compressive force on the upper metal layer to thereby reduce the likelihood of delamination at the interface, and forming a metal structure over the pad such that the metal structure is connected to the exposed upper surface of the upper metal layer through the plurality of openings of the passivation layer.

Another aspect of the present disclosure includes a radio-frequency (RF) apparatus including a base wafer having an integrated circuit (IC) configured to provide RF functionality and a cap wafer implemented over the base wafer. The RF apparatus includes a ring structure implemented to join the cap wafer to the base wafer to yield a hermetic cavity, the ring structure including a pad, the pad including a polymer layer having a side that forms an interface with another layer of the pad, the pad further including an upper metal layer over the interface, the upper metal layer having an upper surface, the ring structure further including a passivation layer implemented over the upper metal layer, the passivation layer including a pattern configured to provide a compressive force on the upper metal layer to thereby reduce the likelihood of delamination at the interface, the pattern defining a plurality of openings to expose the upper surface of the upper metal layer, the ring structure further including a metal structure implemented over the pad such that the metal structure is connected to the exposed upper surface of the upper metal layer through the plurality of openings of the passivation layer.

In some embodiments, the cap wafer of the RF apparatus includes an IC, and in some embodiments, the IC of the cap wafer is at least partially connected electrically to the IC of the base wafer through the ring structure. In some implementations, the RF apparatus further includes a device implemented within the hermetic cavity.

In some embodiments, the device is built on, or a part of, the IC of the base wafer of the RF apparatus. In some embodiments, the device is a MEMS device, and in some embodiments, the device is mounted on the base wafer. In some embodiments, the device of the RF apparatus is a surface acoustic wave (SAW) device, a bulk acoustic wave (BAW) device, or a film bulk acoustic resonator (FBAR) device. In some embodiments, the device is an RF filter.

According to some implementations, the present disclosure relates to a method for fabricating a radio-frequency (RF) apparatus. The method includes providing a base wafer having an integrated circuit (IC) configured to provide RF functionality. The method also includes forming a ring structure on the base wafer such that the ring structure includes a pad, the pad including a polymer layer having a side that forms an interface with another layer of the pad, the pad further including an upper metal layer over the interface, the upper metal layer having an upper surface, the ring structure further including a passivation layer implemented over the upper metal layer, the passivation layer including a pattern configured to provide a compressive force on the upper metal layer to thereby reduce the likelihood of delamination at the interface, the pattern defining a plurality of openings to expose the upper surface of the upper metal layer, the ring structure further including a metal structure implemented over the pad such that the metal structure is connected to the exposed upper surface of the upper metal layer through the plurality of openings of the passivation layer, and mounting a cap wafer on the ring structure to yield a hermetic cavity.

In some implementations, the method includes mounting a device on the base wafer prior to the mounting of the cap wafer. In some embodiments, the mounting of the device includes mounting a surface acoustic wave (SAW) device, a bulk acoustic wave (BAW) device, or a film bulk acoustic resonator (FBAR) device on the base wafer.

The present disclosure further describes a radio-frequency (RF) module including a packaging substrate configured to receive a plurality of components, and an RF apparatus mounted on the packaging substrate, the RF apparatus including a stack structure having a pad, the pad including a polymer layer having a side that forms an interface with another layer of the pad, the pad further including an upper metal layer over the interface, the upper metal layer having an upper surface, the stack structure further including a passivation layer implemented over the upper metal layer, the passivation layer including a pattern configured to provide a compressive force on the upper metal layer to thereby reduce the likelihood of delamination at the interface, the pattern defining a plurality of openings to expose the upper surface of the upper metal layer, the stack structure further including a metal structure implemented over the pad such that the metal structure is connected to the exposed upper surface of the upper metal layer through the plurality of openings of the passivation layer.

In some embodiments, the RF apparatus of the RF module is a flip-chip. In some embodiments, the stack structure of the RF apparatus is a connection structure configured to facilitate mounting of the flip-chip. In some implementations, the RF apparatus is an apparatus having a hermetic cavity. In some implementations, the stack structure is a ring structure that interconnects a base wafer and a cap wafer to yield the hermetic cavity.

According to some implementations, the present disclosure relates to a wireless device including an antenna configured to transmit or receive a radio-frequency (RF) signal, and an RF apparatus configured to process the RF signal, the RF apparatus including a stack structure having a pad, the pad including a polymer layer having a side that forms an interface with another layer of the pad, the pad further including an upper metal layer over the interface, the upper metal layer having an upper surface, the stack structure further including a passivation layer implemented over the upper metal layer, the passivation layer including a pattern configured to provide a compressive force on the upper metal layer to thereby reduce the likelihood of delamination at the interface, the pattern defining a plurality of openings to expose the upper surface of the upper metal layer, the stack structure further including a metal structure implemented over the pad such that the metal structure is connected to the exposed upper surface of the upper metal layer through the plurality of openings of the passivation layer.

In some implementations, the RF apparatus of the wireless device is a flip-chip. In some implementations, the stack structure of the RF apparatus is a connection structure configured to facilitate mounting of the flip-chip. In some embodiments, the RF apparatus is an apparatus having a hermetic cavity. In some embodiments, the stack structure of the RF apparatus is a ring structure that interconnects a base wafer and a cap wafer to yield the hermetic cavity. In some embodiments, the RF apparatus of the wireless device has one or more other qualities of an RF apparatus, a stack structure or chip, as described in the present disclosure.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
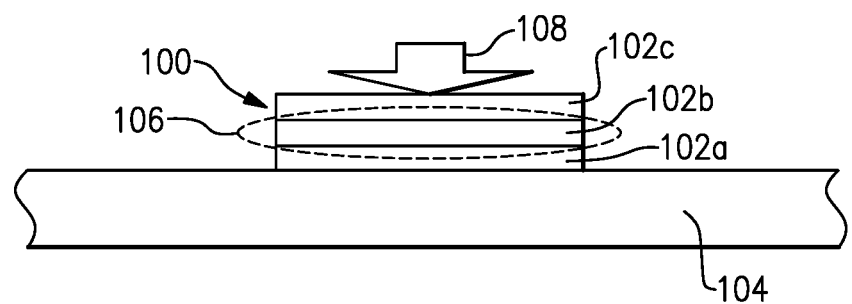
FIG. 1 shows an example stack structure having a plurality of layers formed on a semiconductor substrate, in accordance with some embodiments.

Disclosed are devices and methods related to improved stack structures that can be implemented on semiconductor substrates. FIG. 1 shows an example stack structure 100 having a plurality of layers 102a-102c formed on a semiconductor substrate 104. Among such layers, there may be one or more inter-layer interfaces that are mechanically weaker than other interfaces. For example, suppose that either or both interfaces (with the upper layer 102c and/or the lower layer 102a) associated with the middle layer 102b is/are relatively weak due to one or more reasons. With such weak interface(s), the stack 100 can be damaged (e.g., delaminated) when subjected to a force (e.g., a shear force).

FIG. 1 further shows that in some embodiments, a compressive force (depicted as an arrow 108) can be applied above such weak interface(s) to reduce mechanical damage such as delamination of the stack 100. For example, such a compressive force can be implemented on top of the stack 100 so as to pin down the stack 100 and thereby reduce the likelihood of delamination. Examples of such compressive force applied to different stack structures are described herein in greater detail.

Figure 2:
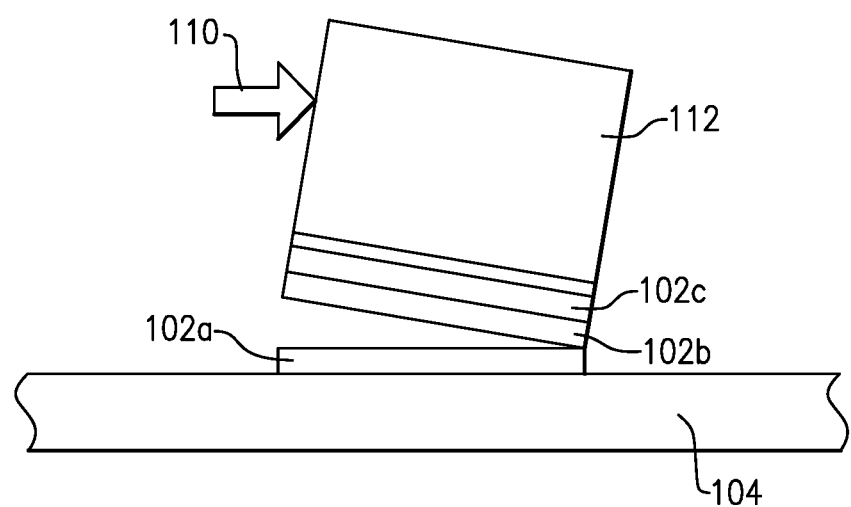
FIG. 2 shows an example of a stack being delaminated due to a shear force, in accordance with some embodiments.

FIG. 2 shows an example of a stack being delaminated due to a shear force 110. For the purpose of description of FIG. 2, suppose that three example layers 102a-102c form the stack, and a relatively large structure 112 is implemented over the stack. Due to the shear force 110 being applied to the structure 112, the stack is shown to delaminate between the layers 102b and 102c, thereby damaging the stack structure.

Examples of the foregoing delamination can include semiconductor fabrication applications (e.g., silicon and gallium arsenide (GaAs) process technology) where polymers are typically used as inter-level dielectric and/or as buffer stress and mechanical protection layers. These polymers can include, for example, polyimide, benzocyclobutene (BCB), polybenzoxazole (PBO), and others. Many of these polymers typically have tensile film stress and are known to have relatively weak adhesion to many other materials such as metals and other dielectrics used in semiconductor technology.

Furthermore, due to flow characteristics of polymers, semiconductor wafers fabricated with polymer inter-level dielectric typically result in non-planar surfaces and topography that can be as large as the underlying device topography. Such non-planar surface and topography usually results in additional stress and weak points at some areas, including, for example, at the interfaces where the polymer is in contact with its neighboring layers.

When used for flip-chip applications, the foregoing semiconductor wafers typically have bump metal pads on each die onto which metal bumps are to be formed. These bump pads typically have a stack structure, and are typically covered with final passivation or topcoat layer (e.g., silicon nitride film) that has a relatively high compressive stress property. The passivation layer is then patterned to open an underlying metal to thereby yield the bump pads.

For each bump pad, there is typically a single large opening having a shape such as an oval or a polygon (e.g., a rectangle or an octagon). However, due to the poor adhesion of one or more polymer layers below the exposed metal layer, and/or topography characteristics of underlying features in the bump pad, poor bump reliability can result when using such large openings. For example, bumps formed on such bump pads can easily be sheared off from the die.

In the context of the polymer inter-level layers in the foregoing example, the layer 102b of FIG. 2 can be a polymer layer, and the layers 102a and 102c can be metal layers. Due to the polymer layer 102b having a relatively weak adhesion property with the metal layers (102a, 102c), the interface between the layers 102a (metal) and 102b (polymer) is shown to fail.

FIGS. 3A-3D show side sectional views of examples of bump pads having different stack configurations, where one or more interfaces between polymer inter-level layer(s) and metal layers can allow relatively easy delamination of the bump pads. FIGS. 4A-4D show examples of metal bumps formed on the corresponding bump pads of FIGS. 3A-3D. Each of the resulting bump assemblies can suffer from delamination as in FIG. 2 when subjected to, for example, a shear force.

In each of the example bump pads of FIGS. 3A-3D, a passivation layer 122 (e.g., silicon nitride) having high compressive stress property is provided. However, a single large opening is formed in the passivation layer 122 to expose and provide access to an upper surface 123 of the upper-most metal layer for mounting of the bump metal. Accordingly, the layers underneath such an opening do not benefit from the compressive force provided by the passivation layer 122. As further shown in FIGS. 4A-4D, when the corresponding metal bump is attached to the bump pad, the passivation layer 122 provides little or no resistance to a shear force applied to the metal bump.

Figure 3A:
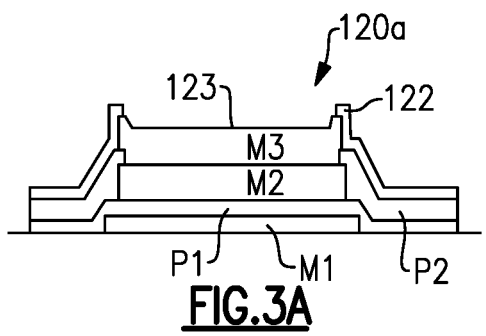
FIGS. 3A-3D show side sectional views of examples of bump pads having different stack configurations, in accordance with some embodiments

In the example of FIG. 3A, a bump pad 120a is shown to include a stack implemented on a semiconductor substrate. More particularly, the stack includes a first metal layer (M1) formed on the semiconductor substrate. The M1 layer is covered with a first polymer layer (P1), and a second metal layer (M2) is formed above the P1 layer, such that the M1 and M2 layers are separated by the P1 layer. A second polymer layer (P2) is shown to be formed over the M2 layer, and an opening in the P2 layer is formed over the M2 layer. A third metal layer (M3) is shown to be formed over the M2 layer such that the M2 and M3 layers are in contact. A passivation layer 122 such as a silicon nitride layer is shown to be formed over the foregoing stack and the region surrounding the stack. An opening is formed in the silicon nitride layer 122 so as to expose the upper surface 123 of the M3 layer.

Figure 4A:
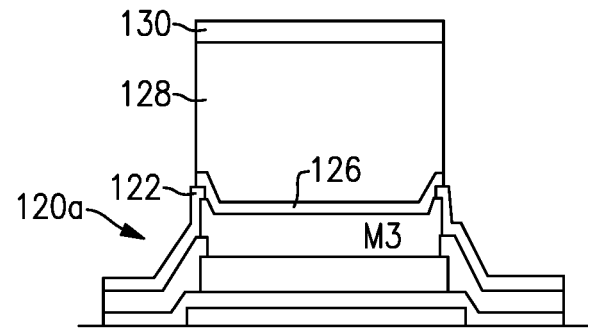
FIGS. 4A-4D show examples of metal bumps formed on the corresponding bump pads of FIG. 3A-3D, in accordance with some embodiments.

In the example of FIG. 4A, a metal bump 128 is shown to be formed on the bump pad 120a of FIG. 3A. More particularly, an under bump metal (UBM) layer 126 is shown to be formed over the opening in the passivation layer 122 so as to cover and be in contact with the upper surface 123 of the M3 layer. The metal bump 128 is shown to be formed over the UBM layer 126, and a solder metal layer 130 is shown to be formed over the metal bump 128.

As described herein, metal-to-metal interfaces are relatively strong, and polymer-to-metal interfaces are relatively weak. Accordingly, metal-to-metal interfaces between the solder metal layer 130 and the metal bump 128, between the metal bump 128 and the UBM layer 126, between the UBM layer 126 and the M3 layer, and between the M3 layer and the M2 layer are relatively strong; and polymer-to-metal interfaces between the M2 layer and the P1 layer, and between the P1 layer and the M1 layer are relatively weak. Thus, when the metal bump 128 and/or the bump pad 120a are subjected to a force such as a shear force, delamination will likely occur at either or both of the interfaces associated with the P1 layer.

Figure 3B:
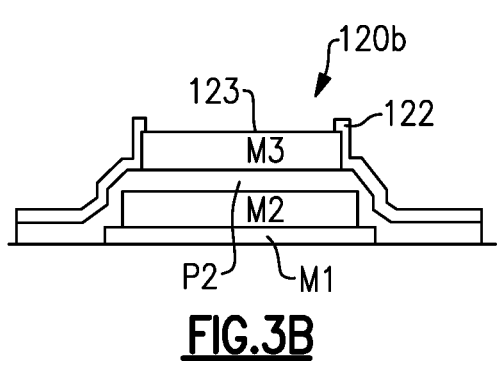

In the example of FIG. 3B, a bump pad 120b is shown to include a stack implemented on a semiconductor substrate. More particularly, the stack includes a first metal layer (M1) formed on the semiconductor substrate. A second metal layer (M2) is formed above the M1 layer, such that the M1 and M2 layers are in contact. A polymer layer (P2) is shown to be formed over the M2 layer. A third metal layer (M3) is shown to be formed over the P2 layer such that the M2 and M3 layers are separated by the P2 layer. A passivation layer 122 such as a silicon nitride layer is shown to be formed over the foregoing stack and the region surrounding the stack. An opening is formed in the silicon nitride layer 122 so as to expose the upper surface 123 of the M3 layer.

Figure 4B:
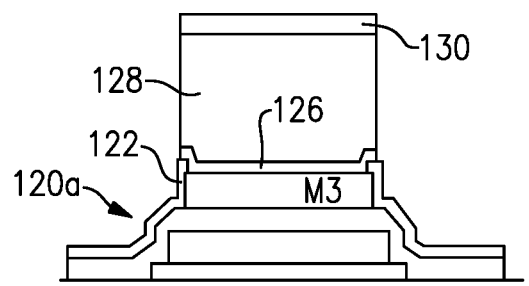

In the example of FIG. 4B, a metal bump 128 is shown to be formed on the bump pad 120b of FIG. 3B. More particularly, an under bump metal (UBM) layer 126 is shown to be formed over the opening in the passivation layer 122 so as to cover and be in contact with the upper surface 123 of the M3 layer. The metal bump 128 is shown to be formed over the UBM layer 126, and a solder metal layer 130 is shown to be formed over the metal bump 128.

In the examples shown in FIGS. 3B and 4B, metal-to-metal interfaces between the solder metal layer 130 and the metal bump 128, between the metal bump 128 and the UBM layer 126, between the UBM layer 126 and the M3 layer, and between the M2 layer and the M1 layer are relatively strong; and polymer-to-metal interfaces between the M3 layer and the P2 layer, and between the P2 layer and the M2 layer are relatively weak. Thus, when the metal bump 128 and/or the bump pad 120b are subjected to a force such as a shear force, delamination will likely occur at either or both of the interfaces associated with the P2 layer.

Figure 3C:
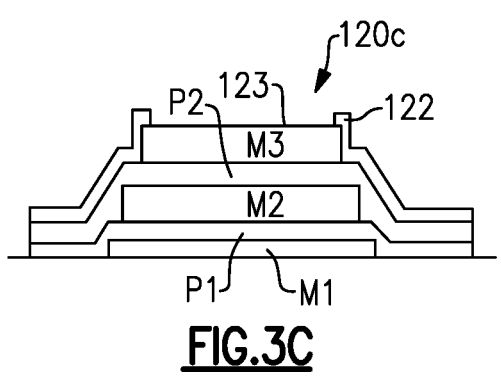

In the example of FIG. 3C, a bump pad 120c is shown to include a stack implemented on a semiconductor substrate. More particularly, the stack includes a first metal layer (M1) formed on the semiconductor substrate, and a first polymer layer (P1) formed over the M1 layer. A second metal layer (M2) is formed above the P1 layer, such that the M1 and M2 layers are separated by the P1 layer. A second polymer layer (P2) is shown to be formed over the M2 layer. A third metal layer (M3) is shown to be formed over the P2 layer such that the M2 and M3 layers are separated by the P2 layer. A passivation layer 122 such as a silicon nitride layer is shown to be formed over the foregoing stack and the region surrounding the stack. An opening is formed in the silicon nitride layer 122 so as to expose the upper surface 123 of the M3 layer.

Figure 4C:
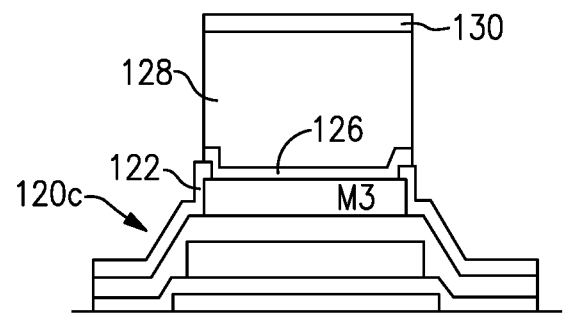

In the example of FIG. 4C, a metal bump 128 is shown to be formed on the bump pad 120c of FIG. 3C. More particularly, an under bump metal (UBM) layer 126 is shown to be formed over the opening in the passivation layer 122 so as to cover and be in contact with the upper surface 123 of the M3 layer. The metal bump 128 is shown to be formed over the UBM layer 126, and a solder metal layer 130 is shown to be formed over the metal bump 128.

In the examples shown in FIGS. 3C and 4C, metal-to-metal interfaces between the solder metal layer 130 and the metal bump 128, between the metal bump 128 and the UBM layer 126, and between the UBM layer 126 and the M3 layer are relatively strong; and polymer-to-metal interfaces between the M3 layer and the P2 layer, between the P2 layer and the M2 layer, between the M2 layer and the P1 layer, and between the P1 layer and the M1 layer are relatively weak. Thus, when the metal bump 128 and/or the bump pad 120b are subjected to a force such as a shear force, delamination will likely occur at one or more of the foregoing interfaces associated with the P1 and P2 layers.

Figure 3D:
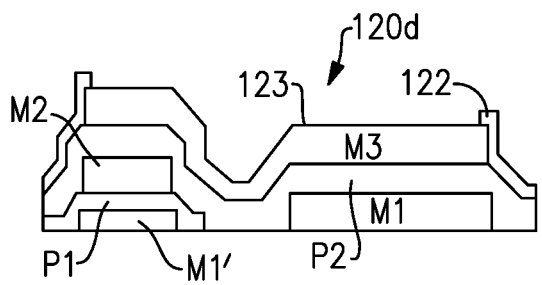

In the example of FIG. 3D, a bump pad 120d is shown to include a stack implemented on a semiconductor substrate. More particularly, the stack includes metal layers M1 and M1' are shown to be formed on the semiconductor substrate. A polymer layer (P1) is shown to be formed over the M1' layer. A metal layer (M2) is shown to be formed above the P1 layer, such that the M1' and M2 layers are separated by the P1 layer. A polymer layer P2 is shown to be formed over the M2 layer and the M1 layer. A metal layer M3 is shown to be formed over the P2 layer such that the M3 layer is separated from each of the M2 layer and the M1 layer by the P2 layer. A passivation layer 122 such as a silicon nitride layer is shown to be formed over the foregoing stack and the region surrounding the stack. An opening is formed in the silicon nitride layer 122 so as to expose the upper surface 123 of the M3 layer.

Figure 4D:
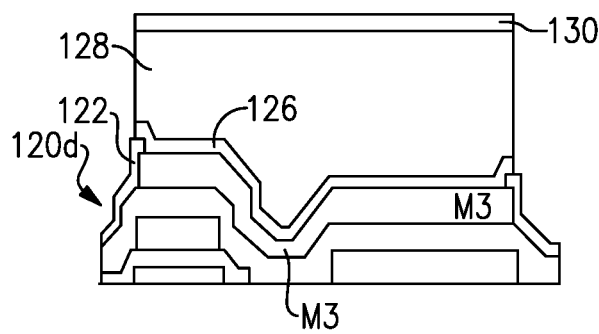

In the example of FIG. 4D, a metal bump 128 is shown to be formed on the bump pad 120d of FIG. 3D. More particularly, an under bump metal (UBM) layer 126 is shown to be formed over the opening in the passivation layer 122 so as to cover and be in contact with the upper surface 123 of the M3 layer. The metal bump 128 is shown to be formed over the UBM layer 126, and a solder metal layer 130 is shown to be formed over the metal bump 128.

In the examples shown in FIGS. 3D and 4D, metal-to-metal interfaces between the solder metal layer 130 and the metal bump 128, between the metal bump 128 and the UBM layer 126, and between the UBM layer 126 and the M3 layer are relatively strong; and polymer-to-metal interfaces between the M3 layer and the P2 layer, between the P2 layer and the M2/M1 layers, between the M2 layer and the P1 layer, and between the P1 layer and the M1' layer are relatively weak. Thus, when the metal bump 128 and/or the bump pad 120b are subjected to a force such as a shear force, delamination will likely occur at one or more of the foregoing interfaces associated with the P1 and P2 layers.

It is noted that the example bump pad 120d shown in FIGS. 3D and 4D is different from the example bump pads of FIGS. 3A-3C, in that the M3 and P2 layers have significant non-planar topographic features. Such non-planar features can result in stress and weak points at certain areas. Thus, the interface between the M3 layer and the P2 layer is a likely location of mechanical failure when the metal bump 128 is subjected to a shear force.

Figure 5:
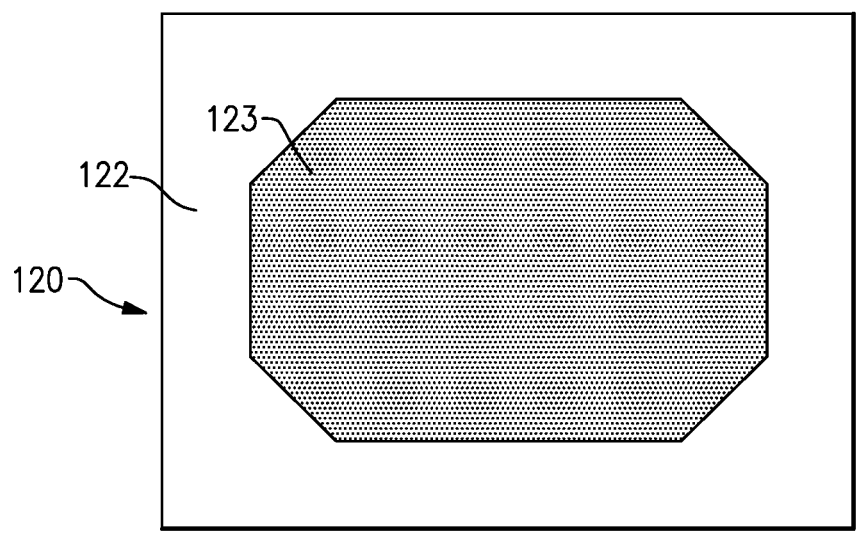
FIG. 5 shows a plan view of an example opening in a passivation layer formed over a bump pad, in accordance with some embodiments.

FIG. 5 depicts a plan view of an example opening in a passivation layer 122 formed over a bump pad 120. Such an opening can be any of the openings in the passivation layers (122) in the examples described in reference to FIGS. 3A-3D. For the purpose of description, suppose that such an opening exposes substantially all of an upper surface 123 of the upper-most metal layer (e.g., M3 in FIGS. 3A-3D). As described herein, such an opening does not allow the compressive stress property of the passivation layer 122 to be transferred effectively to the layers underneath the exposed upper surface 123. Accordingly, one or more weak interfaces underneath the exposed upper surface 123 remain susceptible to delamination.

In some embodiments, an opening in a passivation layer can be dimensioned to cover some or all of a boundary portion of what would otherwise be exposed on a metal surface. Such a configuration can provide compressive force along such a covered boundary portion, which in turn can reduce the likelihood of delamination at one or more underlying interfaces.

Figure 6:
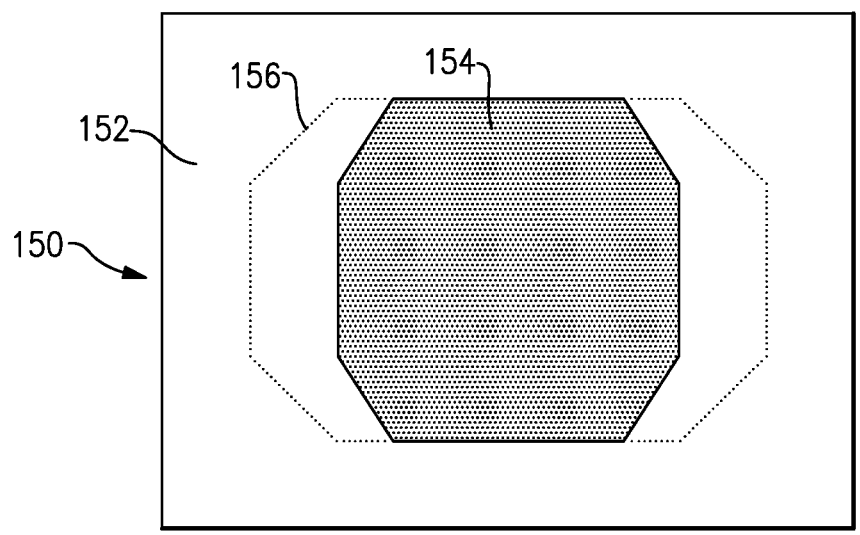
FIG. 6 shows an example of a bump pad with a reduced exposed metal surface, in accordance with some embodiments.

FIG. 6 shows an example of a bump pad 150 where a passivation layer 152 covers left and right edge portions of a metal surface 156, thereby yielding a reduced exposed metal surface 154. The metal surface 156 is depicted in the context of the example of FIG. 5. However, it will be understood that other metal surface configurations and other edge-coverage configurations can also be implemented. For example, the example of FIG. 6 shows edge coverages on the opposing end portions of a rectangular or oval shaped metal surface. In other configurations, such edge coverages can also be implemented to, for example, provide coverage around the entire perimeter of a given metal surface shape.

In the example of FIG. 6, the edge portions of the metal surface 156 being compressed by the passivation layer 152 can reduce the likelihood of delamination at one or more interfaces generally below the metal surface. Greater amount of such an edge coverage can yield greater compressive force on the bump pad; however, too much coverage can negatively impact the quality of metal bump formation on the reduced area of an exposed metal surface. In some embodiments, such an edge coverage of the metal surface can be, for example, at least 5%, 10%, 15%, 20%, 25%, 30%, 35%, 40%, 45%, or 50% of the area of the upper-most metal surface in the absence of a passivation layer.

In the example of FIG. 6, the edge coverage configuration generally does not provide a compressive force at or near the center portion of the exposed metal surface 154. In some applications, such compressive force may be desirable at one or more different locations (e.g., a center portion) of a metal surface. FIGS. 7-14 show non-limiting examples of various configurations where at least some compressive force can be provided at one or more locations other than at or near the edge portions of a metal surface. For the purpose of description, such a metal surface is depicted as the oval shaped example of FIG. 5. However, it will be understood that one or more features of the present disclosure can also be implemented for other shapes of metal surfaces.

Figure 7:
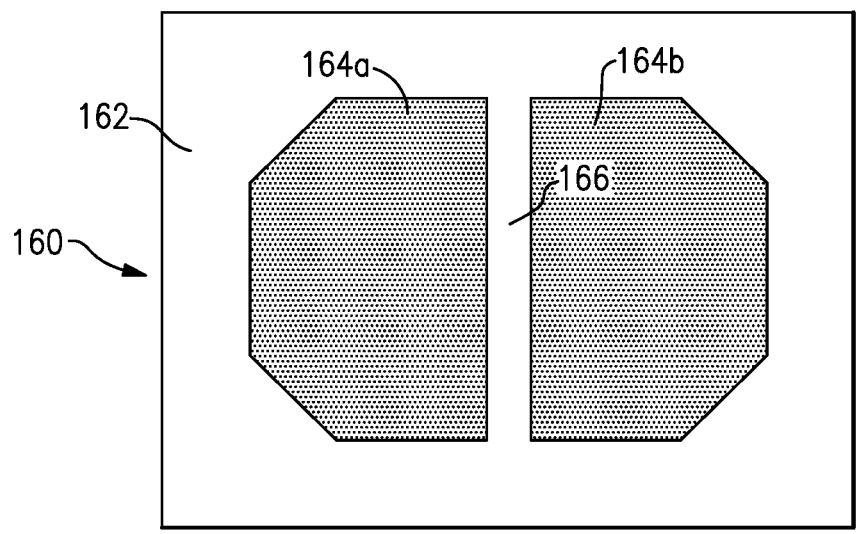
FIG. 7 shows an example bump pad with a strip of passivation through the middle of a metal surface of the pad, in accordance with some embodiments.
Figure 8:
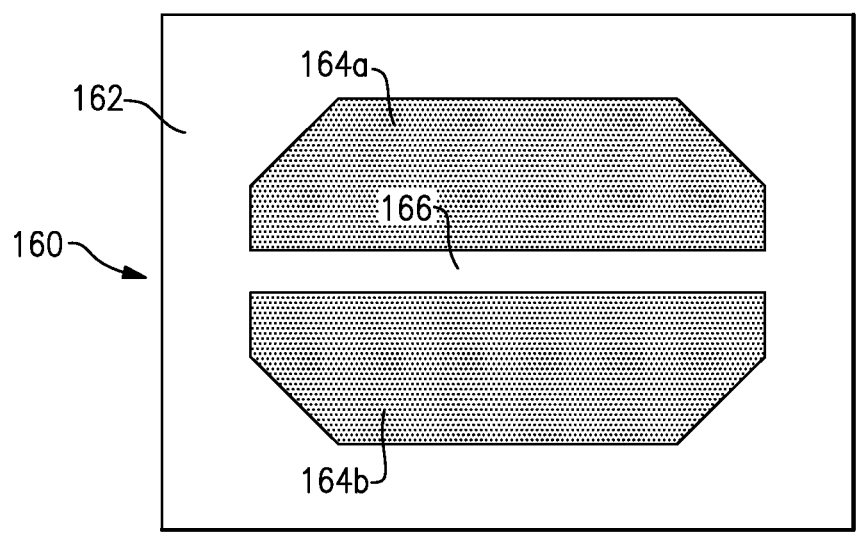
FIG. 8 shows an example bump pad with a strip of passivation through the middle of a metal surface of the pad, in accordance with some embodiments.

FIGS. 7 and 8 show examples of bump pads 160 having a passivation layer 162 which includes a strip 166 extending through a middle portion of a metal surface. In the example of FIG. 7, such a strip is shown to extend top-to-bottom when viewed as shown. Accordingly, exposed portions 164a, 164b of the metal surface are on the left and right, respectively, of the passivation layer strip 166. In the example of FIG. 8, such a strip is shown to extend left-to-right when viewed as shown. Accordingly, exposed portions 164a, 164b of the metal surface are above and below, respectively, of the passivation layer strip 166.

In the examples of FIGS. 7 and 8, the passivation layer strip 166 can be formed by patterning the exposed portions 164a, 164b during the formation of the passivation layer 162. For example, instead of patterning a single large opening to expose the metal surface, two openings corresponding to the exposed portions 164a, 164b can be patterned.

In the example of FIGS. 7 and 8, the passivation layer strip 166 can strap-down the middle portion of the metal surface so as to reduce the likelihood of delamination at one or more underlying interfaces. At the same time, the two exposed metal surfaces 164a, 164b allow formation of contact with, for example, a metal bump.

Figure 9:
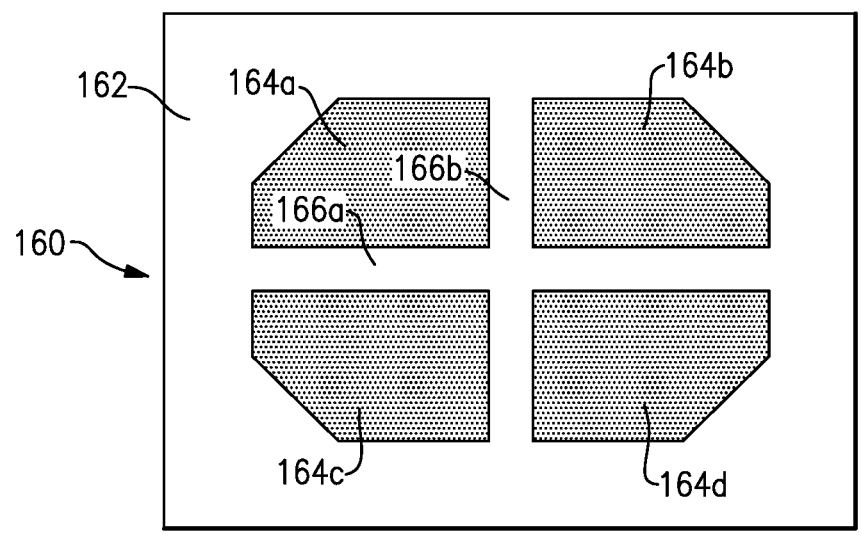
FIG. 9 shows an example bump pad with a plurality of strips of passivation crossing over the metal surface of the pad, in accordance with some embodiments.

In some applications, it may be desirable to have more than one strip of passivation layer to provide more distributed strap-down functionality. Such strips can be arranged in a number of different ways. For example, a plurality of strips can be arranged to be generally parallel. In another example, and as shown in FIG. 9, a plurality of strips can be arranged in a crossing manner. More particularly, FIG. 9 shows an example where the passivation layer (162) can include strips 166a, 166b that generally form a cross pattern at or near the middle portion of the metal surface. Accordingly, four exposed portions (164a, 164b, 164c, 164d) of the metal surface are defined at the four quadrants of the cross pattern. As described herein, such exposed portions of the metal surface can allow formation of contact with, for example, a metal bump.

Figure 10:
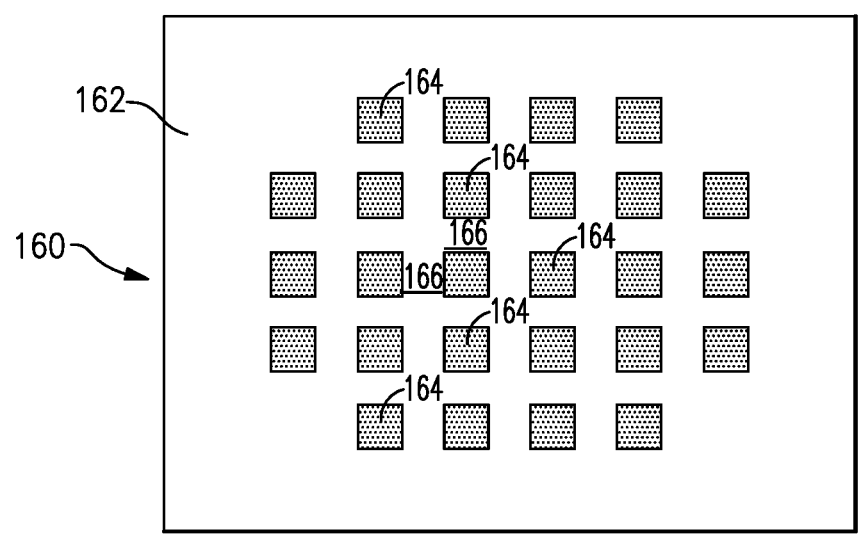
FIG. 10 shows an example bump pad with a plurality of strips of passivation crossing over the metal surface of the pad in a grid-like formation, in accordance with some embodiments.

FIG. 10 shows an example where the passivation layer (162) can include a plurality of strips 166 extending along each of the horizontal and vertical directions (when viewed as shown in FIG. 10), so as to define an array of exposed portions 164 of the metal surface. In the example of FIG. 10, such exposed portions 164 of the metal surface are shown to form a grid of checkerboard pattern.

In the example of FIG. 10, the grid pattern of the strips 166 of the passivation layer 162 can function as a net formed over the bump pad 160. Such a net can provide a compressive force on the bump pad 160, with the compressive force being distributed over the metal surface, while providing a pattern of exposed portions of the metal surface. As described herein, such exposed portions of the metal surface can allow formation of contact with, for example, a metal bump.

Figure 11:
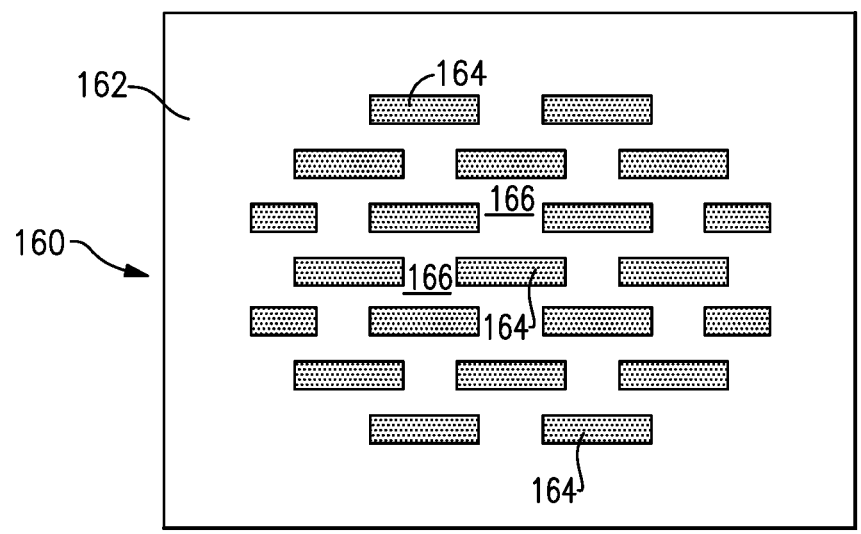
FIG. 11 shows an example bump pad with a plurality of rectangles of passivation offset in a brick formation, in accordance with some embodiments.
Figure 12:
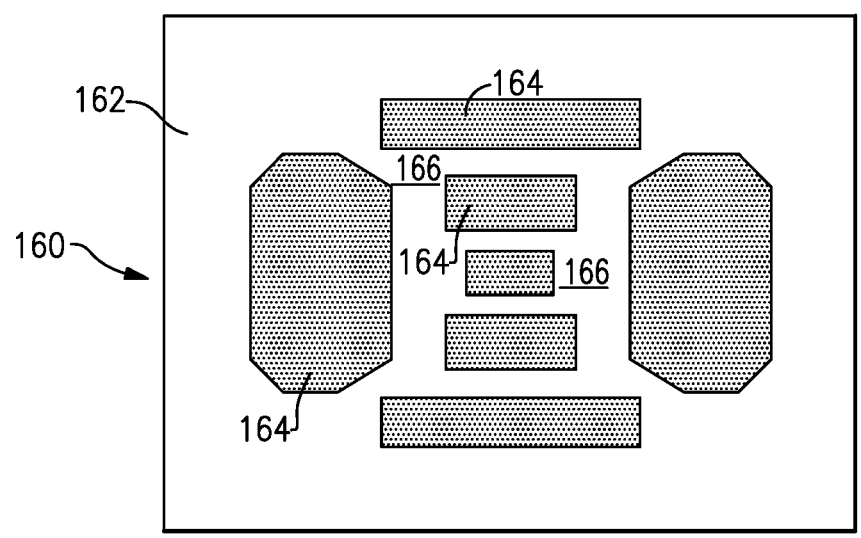
FIG. 12 shows an example bump pad with a plurality of shapes of passivation in various sizes, in accordance with some embodiments.

In the examples of FIGS. 7-10, various strips of passivation layers are depicted as generally straight strips that extend horizontally and/or vertically (when viewed as shown). However, it will be understood that a patterned passivation layer that provides compressive force for a bump pad and also allows formation of a metal structure (such as a metal bump) thereon can include other types of patterns. FIGS. 11-12 show examples of such other types of patterns.

In the example of FIG. 11, a passivation layer 162 can include a pattern 166 so as to yield exposed portions 164 that form rows of stretched rectangles. Such rows can be arranged in a brick pattern, where one row of rectangles is offset from the next row of rectangles. Accordingly, such a pattern 166 of the passivation layer 162 can provide a distributed compressive force on the bump pad 160, while providing a pattern of exposed portions (164) of the metal surface. As described herein, such exposed portions of the metal surface can allow formation of contact with, for example, a metal bump.

FIG. 12 shows that in some embodiments, openings formed on a passivation layer can have more than one shape, and/or more than one size. For example, a passivation layer 162 is shown to be patterned such that the resulting exposed portions 164 of the metal layer include a number of different sized rectangles, as well as irregular polygons. Such a pattern 166 of the passivation layer 162 can provide a distributed compressive force on the bump pad 160, while providing a pattern of exposed portions (164) of the metal surface. As described herein, such exposed portions of the metal surface can allow formation of contact with, for example, a metal bump.

In the examples described in reference to FIGS. 7-12, the metal surfaces and the various opening shapes patterned in their respective passivation layers are depicted as polygons. However, it will be understood that other shapes can also be implemented for the metal surfaces and/or the openings in the passivation layers.

FIGS. 13A-13D show side sectional views of examples of bump pads having different stack configurations, similar to the examples of FIGS. 3A-3D, but where a passivation layer having one or more features as described in reference to FIGS. 6-12 can provide a compressive force on the respective bump pad and thereby reduce the likelihood of delamination at one or more underlying interfaces. FIGS. 14A-14D show examples of metal bumps formed on the corresponding bump pads of FIGS. 13A-13D.

In each of the example bump pads of FIGS. 13A-13D, a passivation layer 162 (e.g., silicon nitride) having high compressive stress property is provided. Such a passivation layer can extend over the uppermost metal layer with a pattern 166 having one or more openings (e.g., exposed portions 164), so as to provide a compressive force distributed over the uppermost metal layer. As mentioned, such a pattern (166) of the passivation layer 162 also defines one or more exposed portions 164 of the metal surface that allows formation of a metal bump in contact with the exposed portion(s) 164 of the metal surface.

Figure 13A:
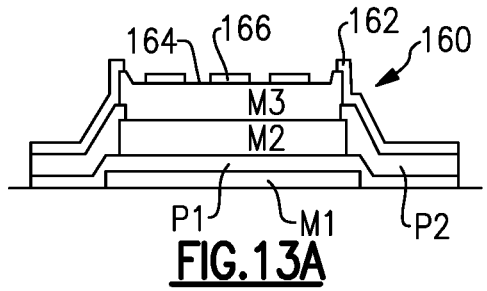
FIGS. 13A-13D show side sectional views of examples of bump pads having different stack configurations, in accordance with some embodiments.

In the example of FIG. 13A, a bump pad 160 is shown to include a stack implemented on a semiconductor substrate. More particularly, the stack includes a first metal layer (M1) formed on the semiconductor substrate. The M1 layer is covered with a first polymer layer (P1), and a second metal layer (M2) is formed above the P1 layer, such that the M1 and M2 layers are separated by the P1 layer. A second polymer layer (P2) is shown to be formed over the M2 layer, and an opening in the P2 layer is formed over the M2 layer. A third metal layer (M3) is shown to be formed over the M2 layer such that the M2 and M3 layers are in contact. A passivation layer 162 such as a silicon nitride layer, is shown to be formed over the foregoing stack and the region surrounding the stack. One or more openings defined by a pattern 166 of the passivation layer 162 are shown to expose the upper surface of the M3 layer so as to allow formation of a metal feature thereon.

Figure 14A:
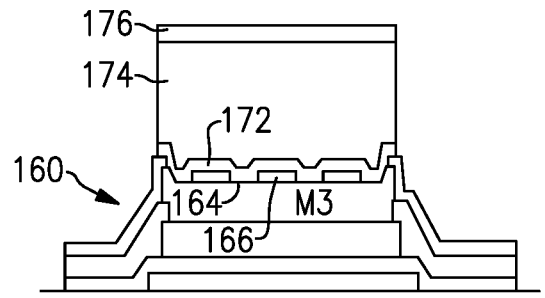
FIGS. 14A-14D show examples of metal bumps formed on the corresponding bump pads of FIGS. 13A-13D, in accordance with some embodiments.

In the example of FIG. 14A, a metal bump 174 is shown to be formed on the bump pad 160 of FIG. 13A. More particularly, an under bump metal (UBM) layer 172 is shown to be formed over the exposed portions 164 of the metal surface of M3 and the patterned portion 166 of the passivation layer 162 so as to cover and be in contact with the exposed portions 164 of the M3 layer. The metal bump 174 is shown to be formed over the UBM layer 172, and a solder metal layer 176 is shown to be formed over the metal bump 174.

As described herein, metal-to-metal interfaces are relatively strong, and polymer-to-metal interfaces are relatively weak. Accordingly, metal-to-metal interfaces between the solder metal layer 176 and the metal bump 174, between the metal bump 174 and the UBM layer 172, between the UBM layer 172 and the exposed portions 164 of the M3 layer, and between the M3 layer and the M2 layer are relatively strong; and polymer-to-metal interfaces between the M2 layer and the P1 layer, and between the P1 layer and the M1 layer are relatively weak. However, even if the metal bump 174 and/or the bump pad 160 are subjected to a force such as a shear force, likelihood of delamination (e.g., at either or both of the interfaces associated with the P1 layer) is reduced by the patterned coverage of the passivation layer 162 over the M3 layer.

Figure 13B:
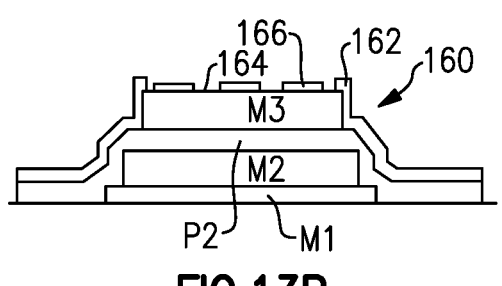

In the example of FIG. 13B, a bump pad 160 is shown to include a stack implemented on a semiconductor substrate. More particularly, the stack includes a first metal layer (M1) formed on the semiconductor substrate. A second metal layer (M2) is formed above the M1 layer, such that the M1 and M2 layers are in contact. A polymer layer (P2) is shown to be formed over the M2 layer. A third metal layer (M3) is shown to be formed over the P2 layer such that the M2 and M3 layers are separated by the P2 layer. A passivation layer 162 such as a silicon nitride layer is shown to be formed over the foregoing stack and the region surrounding the stack. One or more openings defined by a pattern 166 of the passivation layer 162 are shown to expose the upper surface of the M3 layer so as to allow formation of a metal feature thereon.

Figure 14B:
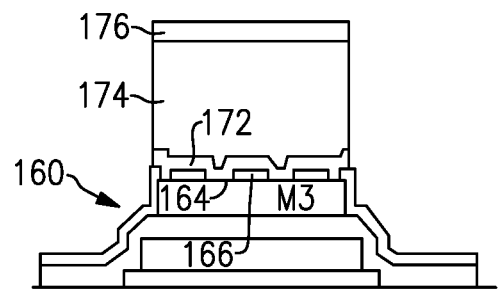

In the example of FIG. 14B, a metal bump 174 is shown to be formed on the bump pad 160 of FIG. 13B. More particularly, an under bump metal (UBM) layer 172 is shown to be formed over the exposed portions 164 of the metal surface of M3 and the patterned portion 166 of the passivation layer 162 so as to cover and be in contact with the exposed portions 164 of the M3 layer. The metal bump 174 is shown to be formed over the UBM layer 172, and a solder metal layer 176 is shown to be formed over the metal bump 174.

As described herein, metal-to-metal interfaces are relatively strong, and polymer-to-metal interfaces are relatively weak. Accordingly, metal-to-metal interfaces between the solder metal layer 176 and the metal bump 174, between the metal bump 174 and the UBM layer 172, between the UBM layer 172 and the exposed portions 164 of the M3 layer, and between the M2 layer and the M1 layer are relatively strong; and polymer-to-metal interfaces between the M3 layer and the P1 layer, and between the P1 layer and the M2 layer are relatively weak. However, even if the metal bump 174 and/or the bump pad 160 are subjected to a force such as a shear force, likelihood of delamination (e.g., at either or both of the interfaces associated with the P1 layer) is reduced by the patterned coverage of the passivation layer 162 over the M3 layer.

Figure 13C:
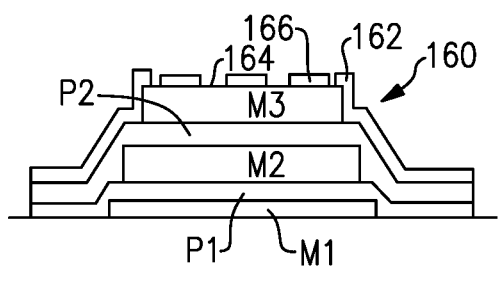

In the example of FIG. 13C, a bump pad 160 is shown to include a stack implemented on a semiconductor substrate. More particularly, the stack includes a first metal layer (M1) formed on the semiconductor substrate, and a first polymer layer (P1) formed over the M1 layer. A second metal layer (M2) is formed above the P1 layer, such that the M1 and M2 layers are separated by the P1 layer. A second polymer layer (P2) is shown to be formed over the M2 layer. A third metal layer (M3) is shown to be formed over the P2 layer such that the M2 and M3 layers are separated by the P2 layer. A passivation layer 162 such as a silicon nitride layer is shown to be formed over the foregoing stack and the region surrounding the stack. One or more openings defined by a pattern 166 of the passivation layer 162 are shown to expose the upper surface of the M3 layer so as to allow formation of a metal feature thereon.

Figure 14C:
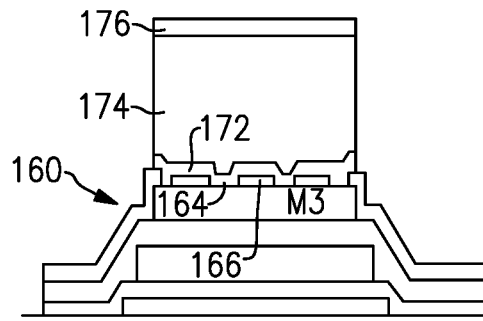

In the example of FIG. 14C, a metal bump 174 is shown to be formed on the bump pad 160 of FIG. 13C. More particularly, an under bump metal (UBM) layer 172 is shown to be formed over the exposed portions 164 of the metal surface of M3 and the patterned portion 166 of the passivation layer 162 so as to cover and be in contact with the exposed portions 164 of the M3 layer. The metal bump 174 is shown to be formed over the UBM layer 172, and a solder metal layer 176 is shown to be formed over the metal bump 174.

As described herein, metal-to-metal interfaces are relatively strong, and polymer-to-metal interfaces are relatively weak. Accordingly, metal-to-metal interfaces between the solder metal layer 176 and the metal bump 174, between the metal bump 174 and the UBM layer 172, and between the UBM layer 172 and the exposed portions 164 of the M3 layer are relatively strong; and polymer-to-metal interfaces between the M3 layer and the P2 layer, between the P2 layer and the M2 layer, between the M2 layer and the P1 layer, and between the P1 layer and the M1 layer are relatively weak. However, even if the metal bump 174 and/or the bump pad 160 are subjected to a force such as a shear force, likelihood of delamination (e.g., at one or more of the interfaces associated with the P1 and P2 layers) is reduced by the patterned coverage of the passivation layer 162 over the M3 layer.

Figure 13D:
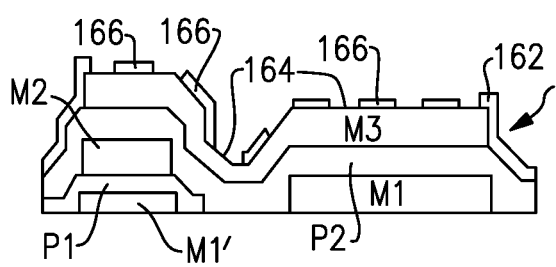

In the example of FIG. 13D, a bump pad 160 is shown to include a stack implemented on a semiconductor substrate. More particularly, the stack includes metal layers M1 and M1' are shown to be formed on the semiconductor substrate. A polymer layer (P1) is shown to be formed over the M1' layer. A metal layer (M2) is shown to be formed above the P1 layer, such that the M1' and M2 layers are separated by the P1 layer. A polymer layer P2 is shown to be formed over the M2 layer and the M1 layer. A metal layer M3 is shown to be formed over the P2 layer such that the M3 layer is separated from each of the M2 layer and the M1 layer by the P2 layer. A passivation layer 162 such as a silicon nitride layer is shown to be formed over the foregoing stack and the region surrounding the stack. One or more openings defined by a pattern 166 of the passivation layer 162 are shown to expose the upper surface of the M3 layer so as to allow formation of a metal feature thereon.

Figure 14D:
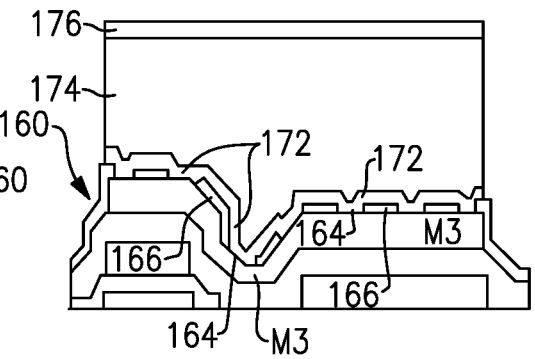

In the example of FIG. 14D, a metal bump 174 is shown to be formed on the bump pad 160 of FIG. 13D. More particularly, an under bump metal (UBM) layer 172 is shown to be formed over the exposed portions 164 of the metal surface of M3 and the patterned portion 166 of the passivation layer 162 so as to cover and be in contact with the exposed portions 164 of the M3 layer. The metal bump 174 is shown to be formed over the UBM layer 172, and a solder metal layer 176 is shown to be formed over the metal bump 174.

As described herein, metal-to-metal interfaces are relatively strong, and polymer-to-metal interfaces are relatively weak. Accordingly, metal-to-metal interfaces between the solder metal layer 176 and the metal bump 174, between the metal bump 174 and the UBM layer 172, and between the UBM layer 172 and the exposed portions 164 of the M3 layer are relatively strong; and polymer-to-metal interfaces between the M3 layer and the P2 layer, between the P2 layer and the M2/M1 layers, between the M2 layer and the P1 layer, and between the P1 layer and the M1' layer are relatively weak. However, even if the metal bump 174 and/or the bump pad 160 are subjected to a force such as a shear force, likelihood of delamination (e.g., at one or more of the interfaces associated with the P1 and P2 layers) is reduced by the patterned coverage of the passivation layer 162 over the M3 layer.

It is noted that the example bump pad 160 shown in FIGS. 13D and 14D is different from the example bump pads of FIGS. 13A-13C, in that the M3 and P2 layers have significant non-planar topographic features. Such non-planar features can result in stress and weak points at certain areas. Thus, the interface between the M3 layer and the P2 layer is a likely location of mechanical failure when the metal bump 174 is subjected to a shear force. Accordingly, in some embodiments, the patterned portion 166 of the passivation layer 162 can be configured to accommodate such stressed and weak points.

Various examples described herein in reference to FIGS. 3-14 are generally related to bump pads and metal bumps implemented thereon. FIGS. 15-17 show that in some embodiments, one or more features of the present disclosure can also be implemented in other applications, including, for example, a stacked wall structure to form a cavity (e.g., hermetic cavity) on a substrate such as a wafer.

Figure 15A:
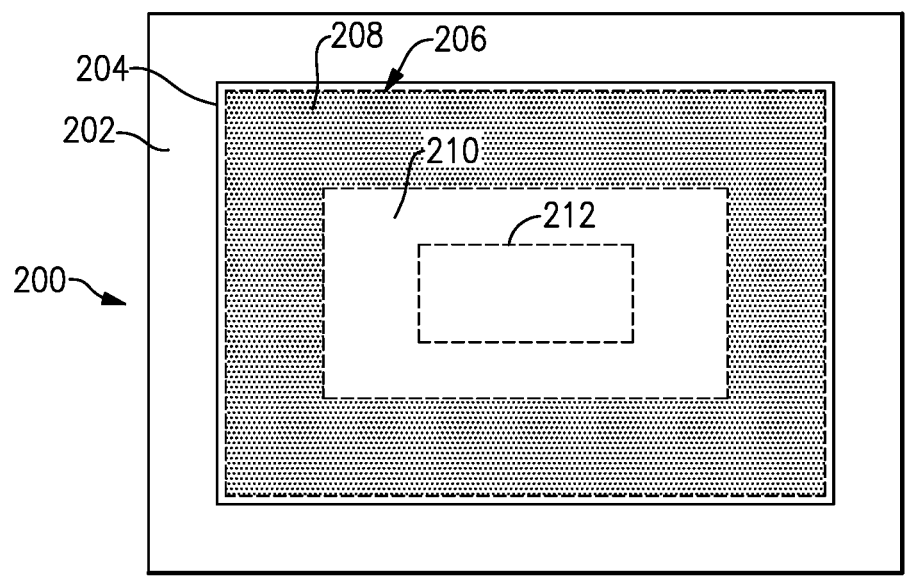
FIGS. 15A and 15B show a plan view and a side sectional view of a hermetic cavity structure implemented on a base layer, in accordance with some embodiments.
Figure 15B:
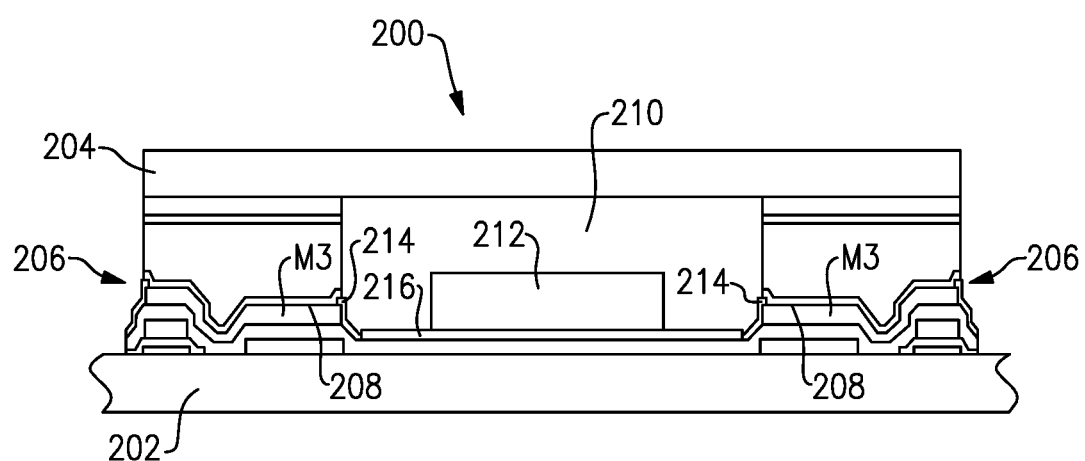

FIGS. 15A and 15B show a plan view and a side sectional view of a hermetic cavity structure 200 implemented on a base layer 202 such as a wafer. Although not shown, such a base wafer can include one or more circuits. A stack structure 206 is shown to surround an inner area 210. Such a stack structure can include one or more features as described herein. Such an inner area can be dimensioned to allow implementation of one or more devices (depicted as 212) therein. Such a device may be built on or be a part (e.g., a MEMS device) of the circuitry of the base wafer 202, may be a separate device (e.g., a SAW, BAW, or FBAR) that is attached to the surface of the base wafer 202, or any combination thereof. As shown in FIG. 15B, the device 212 can be mounted on a metal layer 216 which is formed above a polymer layer. In some embodiments, such a polymer layer can be an extension of the P2 layer described in reference to FIGS. 3D and 4D.

A cap layer 204 such as a wafer is shown to be mounted on the stack structure 206 so as to enclose the inner area 210 into a hermetically sealed cavity. Such a cap wafer may be configured to provide sealing functionality, may contain one or more circuits configured to perform some desired function in conjunction with the base wafer, or any combination thereof.

In the example of FIGS. 15A and 15B, the stack structure 206 is depicted as having a sectional configuration that is similar to the example of FIGS. 3D and 4D. Accordingly, such a stack structure includes an upper surface 208 of the M3 layer that is exposed before implementation of a metal layer functionally similar to the UBM layer. As described herein, such an exposed metal surface (depicted as 208 in FIG. 15A) generally does not provide a compressive force to resist delamination of one or more underlying interfaces.

Figure 16A:
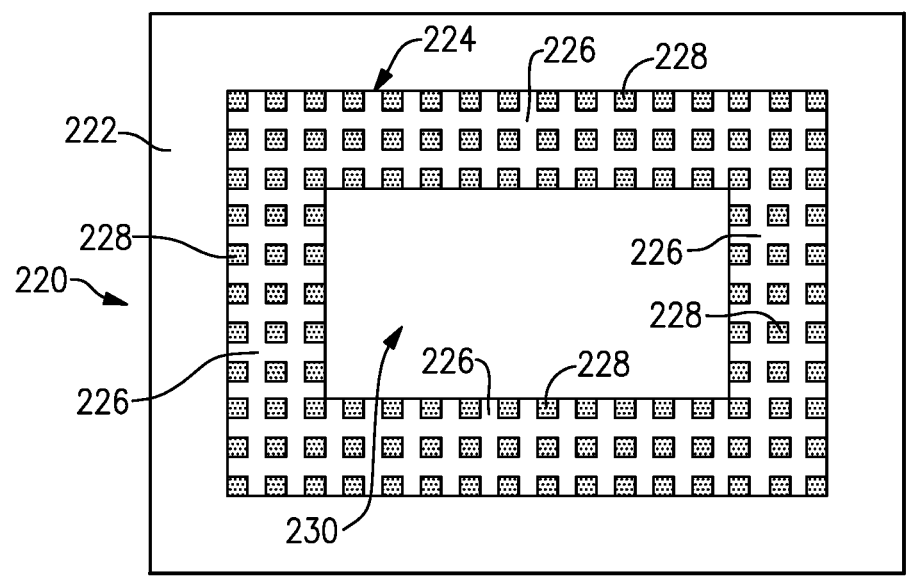
FIGS. 16A and 16B show a plan view and a side sectional view of a pad structure implemented on a base layer, in accordance with some embodiments.
Figure 16B:
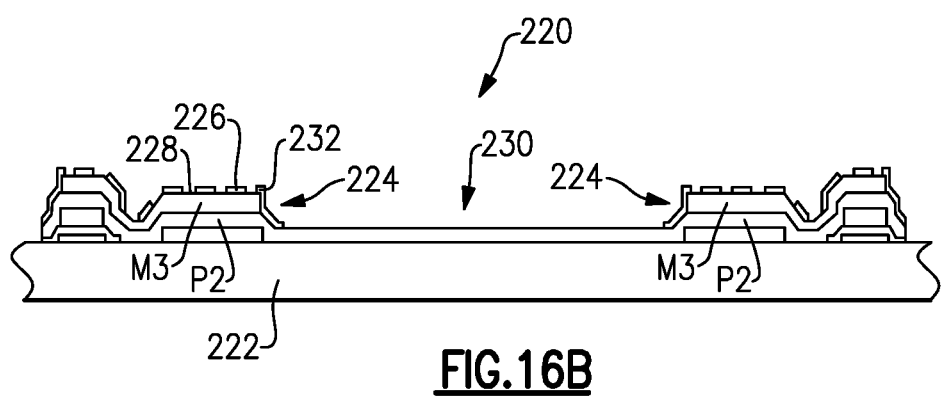

FIGS. 16A and 16B show a plan view and a side sectional view of a pad structure 224 implemented on a base layer 222 such as a wafer. Such a pad structure can be utilized to build a hermetic cavity structure as described herein. For the purpose of description, it will be assumed that the base wafer 222 is similar to the base wafer 202 of FIGS. 15A and 15B.

In the example of FIGS. 16A and 16B, the pad structure 224 is depicted as having a sectional configuration that is similar to the example of FIGS. 13D and 14D. Accordingly, such a pad structure includes exposed portions 228 of the M3 layer defined by a patterned portion 226 of a passivation layer 232. As described herein, such a patterned coverage of the passivation layer over the metal surface provides a compressive force to resist delamination of one or more underlying interfaces.

As shown in FIGS. 16A and 16B, the pad structure 224 is shown to define an inner area 230 which can be dimensioned to allow implementation of one or more devices therein. To facilitate such device(s), a polymer layer (e.g., an extension of the P2 layer) can be implemented over the base wafer 222.

Figure 17A:
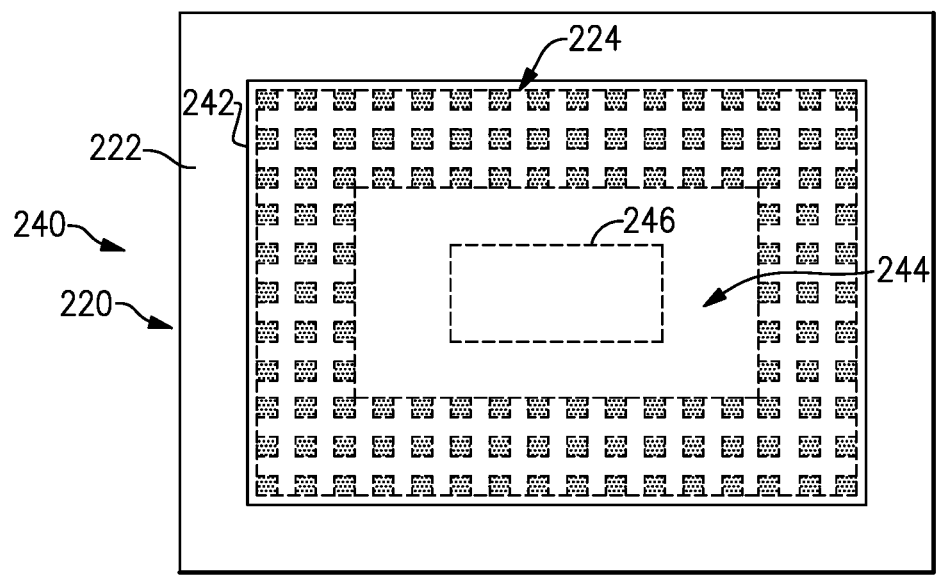
FIGS. 17A and 17B show a plan view and a side sectional view of a hermetic cavity structure that is similar to the example of FIGS. 15A and 15B, but with the pad structure as described in reference to FIGS. 16A and 16B, in accordance with some embodiments.
Figure 17B:
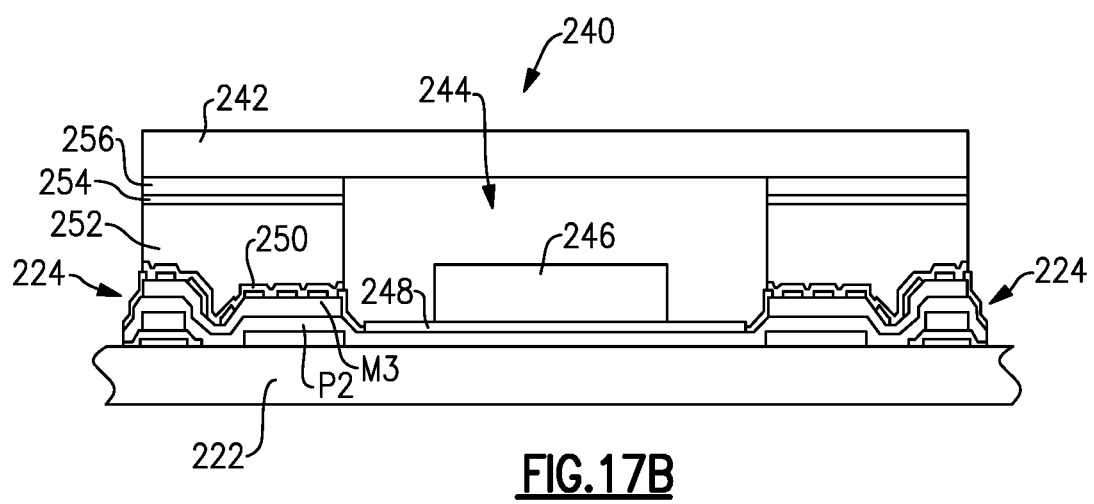

FIGS. 17A and 17B show a plan view and a side sectional view of a hermetic cavity structure 240 that is similar to the example of FIGS. 15A and 15B, but with the pad structure 224 as described in reference to FIGS. 16A and 16B. With the pattern of exposed openings, the interface(s) underneath the M3 layer is/are less likely to delaminate, and at the same time, the exposed portions of the M3 layer can allow formation of metal-to-metal contact with a metal layer 250 which can be functionally similar to the UBM layer (e.g., 172 in FIG. 14D). A metal ring 252 can be formed over the metal layer 250. A cap layer 242 such as a wafer can be secured to the metal ring 252 through, for example, one or more solder metal layers (e.g., 254, 256). In some embodiments, such a cap wafer can be configured similar to the example of FIGS. 15A and 15B.

In the example of FIGS. 17A and 17B, the pad structure 224 having the patterned portion of the passivation layer (232 in FIG. 16B) allows the hermetic cavity structure 240 to be more robust than the example of FIGS. 15A and 15B. As described herein, such robustness can be provided by a compressive force over one or more polymer-metal interfaces.

In the example of FIGS. 17A and 17B, a hermetic cavity 244 formed generally in the inner area of FIGS. 16A and 16B is shown to be dimensioned to allow implementation of one or more devices (depicted as 246). The device 246 is shown to be mounted on a metal layer 248 which is in turn applied over a polymer layer (e.g., polymer layer P2). Such a device can be similar to the device 212 described in reference to FIGS. 15A and 15B.

In the various examples of FIGS. 15-17, the cavities formed by their respective stack structures are described as being hermetic cavities. It will be understood that one or more features of the present disclosure can be implemented in applications involving cavities that may or may not have hermetic property. It will also be understood that one or more features of the present disclosure can be implemented in applications where stack structures do not necessarily form a complete ring around an inner area.

Figure 18:
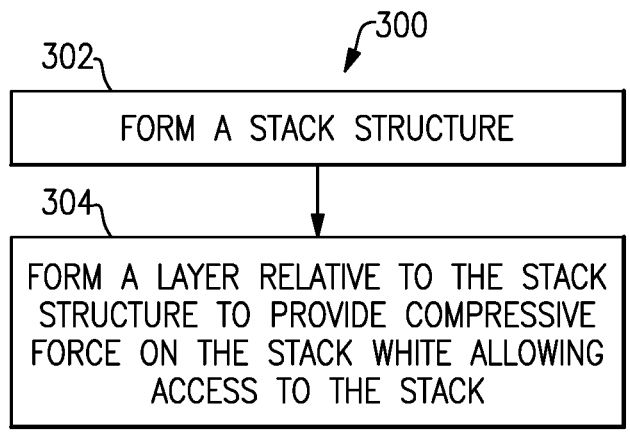
FIG. 18 shows a process that can be implemented to form a robust stack structure, in accordance with some embodiments.

FIG. 18 shows a process 300 that can be implemented to form a robust stack structure having one or more features as described herein. In block 302, a stack structure can be formed. In block 304, a layer can be formed relative to the structure to provide a compressive form on the stack while allowing access to the stack. For example, the layer is a passivation layer, as described above with respect to FIGS. 3A to 17B.

Figure 19:
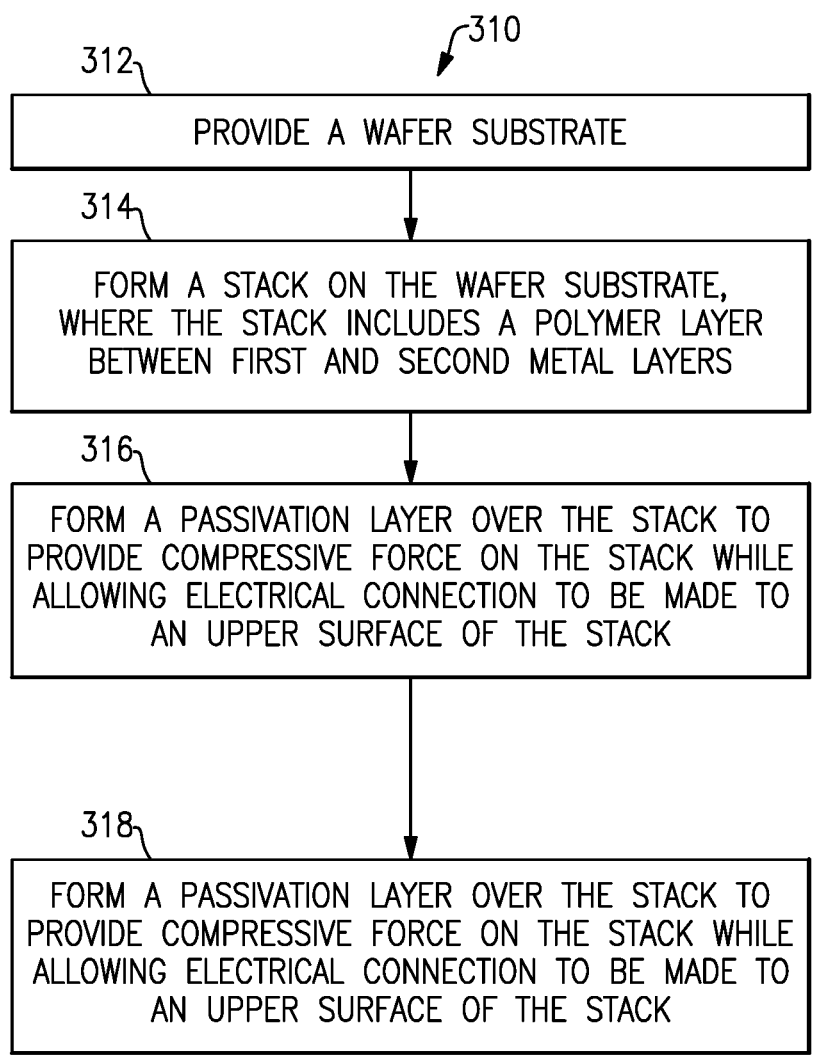
FIG. 19 shows a process that can be implemented to form a robust stack structure, in accordance with some embodiments.

FIG. 19 show a process 310 that can be implemented as a more specific example of the process 300 of FIG. 18. In block 312, a substrate such as a wafer can be provided. In block 314, a stack structure can be formed on the wafer substrate, where the stack includes a polymer layer between first and second metal layers. In block 316, a passivation layer can be formed over the stack to provide a compressive force on the stack while allowing an electrical connection to be made to an upper surface of the stack. The process 310 can further include block 318 where a conductive structure can be formed over the passivation layer such that the conductive structure is electrically connected to the upper surface of the stack.

As described herein, the stack structure of block 314 can be, for example, a bump pad of FIGS. 7-14, and the conductive structure of block 318 can be, for example, a metal bump of FIGS. 14A-14D. As also described herein, the stack structure of block 314 can be, for example, a pad structure of FIGS. 16A and 16B, and the conductive structure of block 318 can be, for example, a metal ring of FIGS. 17A and 17B.

Figure 20:
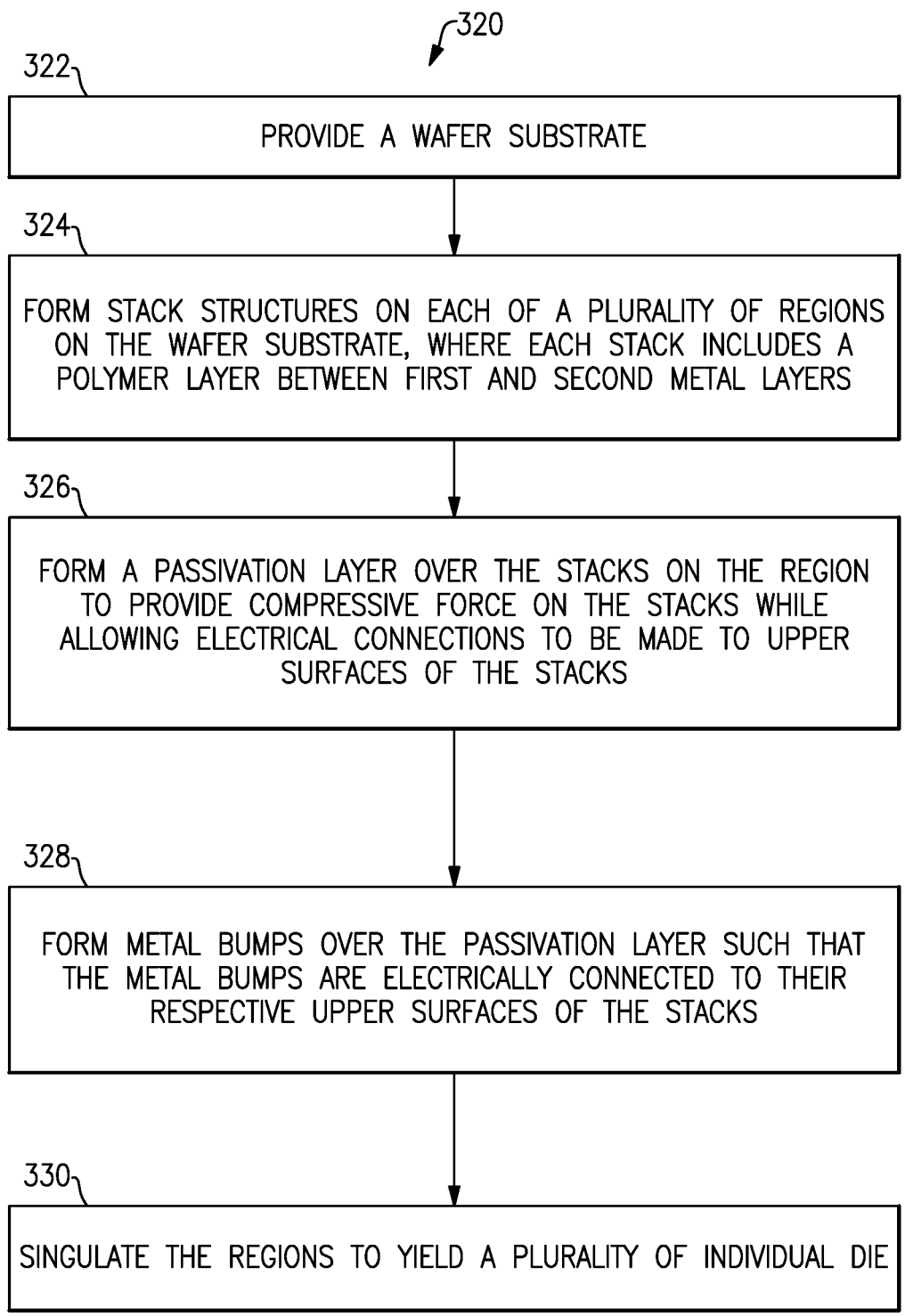
FIG. 20 shows a process that can be implemented to manufacture a number of devices, in accordance with some embodiments.

In some embodiments, a device having delamination-resistance as described herein can be fabricated in a wafer form and be singulated. FIG. 20 shows a process 320 that can be implemented to manufacture a number of such devices. In block 322, a wafer substrate can be provided. In block 324 a stack structure can be formed on each of a plurality of regions on the wafer substrate, where each stack structure includes a polymer layer between first and second metal layers. In block 326, a passivation layer can be formed over the stack structures, and appropriate patterned openings can be formed over each stack structure to provide a compressive force on the stack structure while allowing an electrical connection to be made to the upper surface of the stack structure. In block 328, a metal structure such as a metal bump can be formed over the passivation layer of each stack structure, such that the metal structure is electrically connected to the upper surface of the stack structure. In block 330, the regions can be singulated to yield a plurality of individual die.

Figure 21:
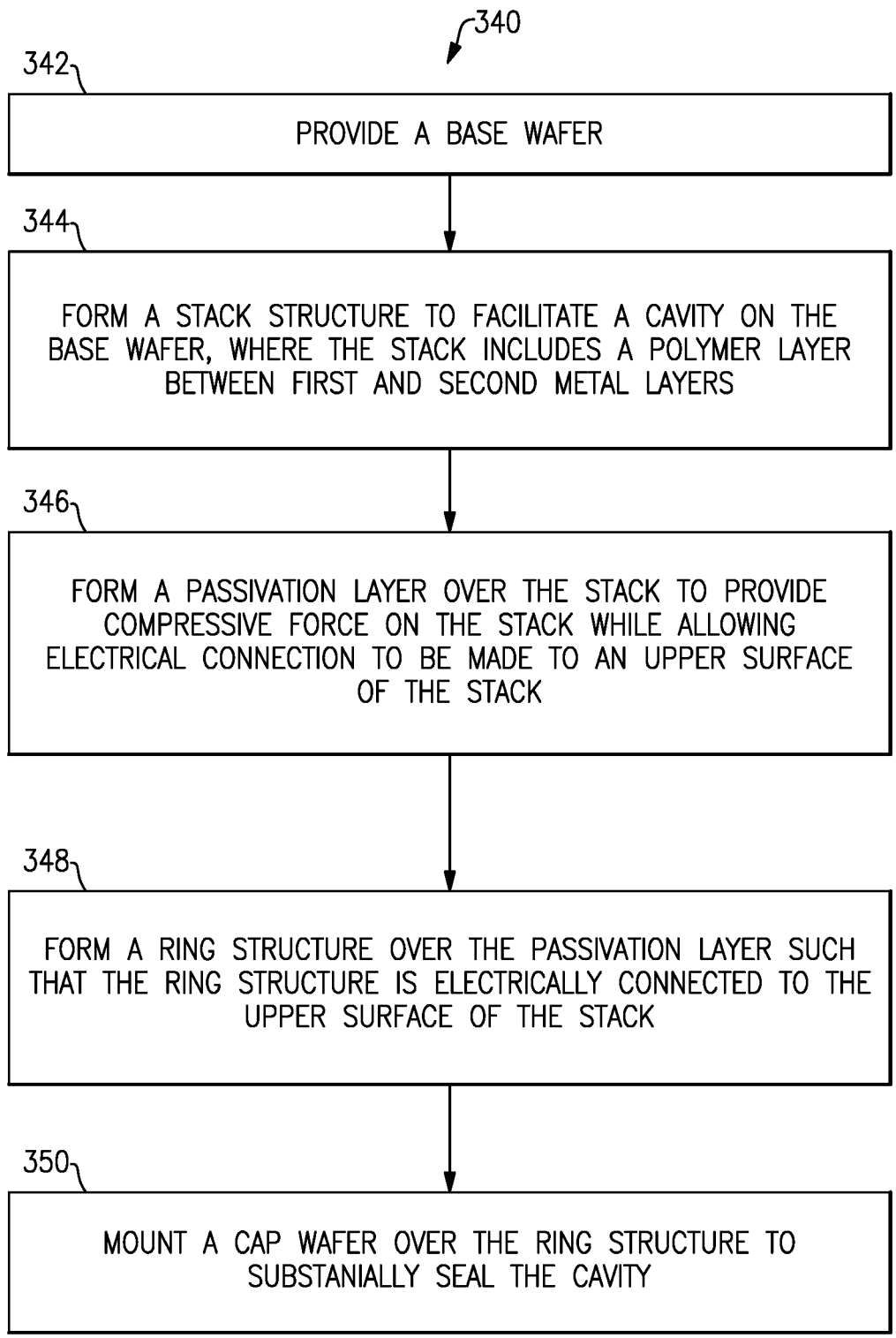
FIG. 21 shows a process that can be implemented to fabricate a cavity structure, in accordance with some embodiments.

FIG. 21 shows a process 340 that can be implemented to fabricate a cavity structure having one or more features as described herein. In block 324, a base wafer can be provided. In block 344, a pad structure can be formed on the base wafer to facilitate the cavity, where the pad structure includes a polymer layer between first and second metal layers. In block 346, a passivation layer can be formed over the pad structure to provide a compressive force of the pad structure while allowing an electrical connection to be made to an upper surface of the pad structure. In block 348, a ring structure can be formed over the passivation layer such that the ring structure is electrically connected to the upper surface of the pad structure. In block 350, a cap wafer can be mounted over the ring structure to substantially seal the cavity.

In the example of FIG. 21, the sealed cavity can provide a hermetic cavity environment for one or more circuits and/or devices implemented therein. In the context of a device being implemented in such a hermetic cavity, the device can be mounted on the base wafer at different stages of the fabrication process 340 of FIG. 21. For example, the device can be mounted on the base wafer before or after the formation of the pad structure. The device can also be mounted on the base wafer before or after the formation of the ring structure.

Figure 22:
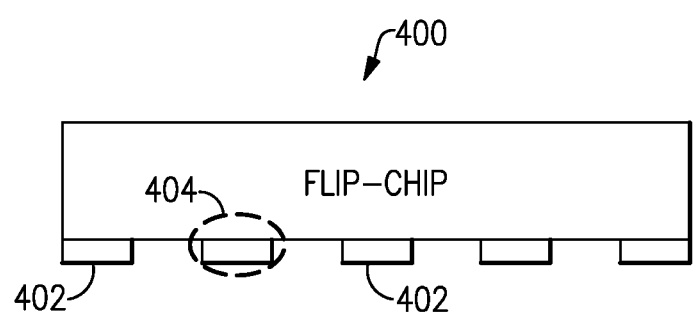
FIG. 22 shows an example flip-chip having a plurality of bump structures, in accordance with some embodiments.
Figure 23:
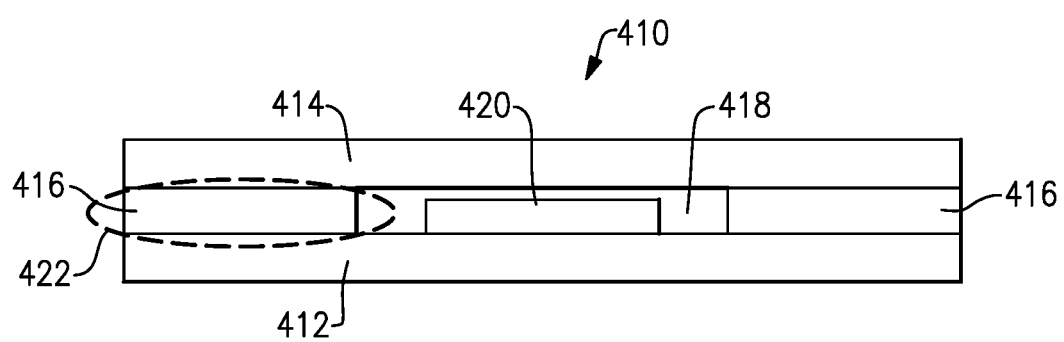
FIG. 23 shows an example product with a hermetic cavity device, a cavity formed by a base layer, a ring structure and a cap layer.

FIGS. 22 and 23 show non-limiting examples of products that can include and benefit from one or more features as described herein. FIG. 22 shows that in some embodiments, a flip-chip 400 can include a plurality of bump structures 402 configured to provide electrical connection and/or mounting functionalities. Such bump structures can include bump pads as described herein, and metal bumps formed on such bump pads. Some or all of such bump structures can include a compressive force configuration (depicted as 404) as described herein to reduce the likelihood of delamination at one or more interfaces within the bump structures.

In some embodiments, the flip-chip 400 of FIG. 22 can be configured for radio-frequency (RF) applications. In other embodiments, a flip-chip having one or more features as described herein can also be implemented in other electronic applications.

In some embodiments, a flip-chip having bump structures as described herein can include a substrate layer, and such bump structures can be implemented on such a substrate layer. In some embodiments, the substrate layer can be a semiconductor layer (e.g., a semiconductor die). Such a semiconductor layer can include, for example, an integrated circuit (IC). In some embodiments, the substrate layer can be a semi-insulating layer such as a gallium arsenide (GaAs) layer. Such a semi-insulating layer can include, for example, a passive circuit. In some embodiments, the substrate layer can be an insulator layer such as glass or sapphire.

In the context of RF applications, one or more flip-chips as described herein can be utilized in wireless devices. Such wireless devices can include, for example, a cellular phone, a smart-phone, a hand-held wireless device with or without phone functionality, a wireless tablet, etc.

FIG. 23 shows that in some embodiments, a hermetic cavity device 410 can include a cavity 418 formed by a base layer 412, a ring structure 416, and a cap layer 414. Such a cavity can provide a hermetically sealed environment for a component 420.

In some embodiments, the ring structure 416 may or may not include a compressive force configuration (depicted as 422) as described herein. With such a compressive force configuration, the likelihood of delamination at one or more interfaces within the ring structure 416 can be reduced.

In some embodiments, the base layer 412 can be a base wafer, and the cap layer 414 can be a cap wafer. Although the base wafer 412 is depicted as having the same lateral size as the cap wafer 414, it will be understood that the base wafer 412 can be larger, and can include one or more other components mounted thereon with or without cavity(ies).

In some embodiments, the component 420 implemented within the cavity 418 can be a device that is built on the base wafer 412, a part (e.g., a MEMS) of a circuitry of the base wafer 412, a separate device (such as a SAW, BAW, or FBAR) that is attached to the surface of the base wafer 412, or any combination thereof. In some embodiments, hermetic cavity device 410 having such a device (e.g., component 420) can be configured for radio-frequency (RF) applications. In other embodiments, a hermetic cavity device having one or more features as described herein can also be implemented in other electronic applications.

In the context of RF applications, one or more hermetic cavity devices as described herein can be utilized in wireless devices. Such wireless devices can include, for example, a cellular phone, a smart-phone, a hand-held wireless device with or without phone functionality, a wireless tablet, etc.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A stack structure comprising:
a pad implemented on a substrate, the pad including a first stack including a first metal layer and a second stack including a second metal layer, the pad further including a polymer layer having a lower surface that forms an interface with the first metal layer of the first stack and the second metal layer of the second stack, and having a wall on a side of the polymer layer, the pad further including an upper metal layer over the polymer layer, the upper metal layer having an upper surface on which to implement a metal bump and having a wall on a side of the upper metal layer; and
a passivation layer including first and second portions, the first portion configured to cover the wall of the upper metal layer and to cover the wall of the polymer layer, the first portion extending downward following the shape of the wall of the upper metal layer and the wall of the polymer layer, the second portion implemented over the upper metal layer, the second portion of the passivation layer including a pattern defining a plurality of openings in the second portion of the passivation layer within a peripheral boundary of the pad to expose a plurality of portions of the upper surface of the upper metal layer of the pad, the pattern spanning across the first stack and the second stack, the pattern including the plurality of openings configured to distribute a compressive force on the upper metal layer.

2. The stack structure of claim 1 further comprising a metal bump implemented over the pad such that the metal bump is connected to the exposed plurality of portions of the upper surface of the upper metal layer through the plurality of openings of the second portion of the passivation layer.

3. The stack structure of claim 2 wherein the first stack includes another metal layer and another polymer layer such that the other polymer layer is between the first metal layer and the other metal layer.

4. The stack structure of claim 3 wherein the other metal layer is below the first metal layer.

5. The stack structure of claim 3 wherein the polymer layer forms an interface with the other polymer layer.

6. The stack structure of claim 2 wherein the pattern defining the plurality of openings is configured to function as a strap or a net over the upper metal layer to thereby provide the compressive force on the upper metal layer.

7. The stack structure of claim 6 wherein the strap or the net of the pattern is substantially contiguous around the plurality of openings.

8. The stack structure of claim 2 wherein the substrate is a semiconductor substrate.

9. The stack structure of claim 8 wherein the semiconductor substrate is a flip-chip substrate.

10. The stack structure of claim 9 wherein the pad is a bump pad.

11. The stack structure of claim 8 wherein the semiconductor substrate is a base wafer layer having an integrated circuit.

12. The stack structure of claim 11 wherein the stack structure is configured to form a ring on the base wafer layer, the ring defining an inner area dimensioned to accommodate a device, the ring further configured to allow mounting of a cap wafer to substantially enclose the inner area.

13. The method of claim 12 further comprising forming a metal bump over the pad such that the metal bump is connected to the exposed plurality of portions of the upper surface of the upper metal layer through the plurality of openings of the second portion of the passivation layer.

14. A method for fabricating a stack structure, the method comprising:
providing a substrate;
forming a pad on the substrate such that the pad includes a first stack including a first metal layer and a second stack including a second metal layer, the pad further including a polymer layer having a lower surface that forms an interface with the first metal layer of the first stack and the second metal layer of the second stack, and having a wall on a side of the polymer layer, the pad further including an upper metal layer over the polymer layer, the upper metal layer having an upper surface on which to implement a metal bump and having a wall on a side of the upper metal layer;
forming a first portion of a passivation layer, the first portion configured to cover the wall of the upper metal layer and to cover the wall of the polymer layer, the first portion extending downward following the shape of the wall of the upper metal layer and the wall of the polymer layer; and
forming a second portion of the passivation layer over the upper metal layer, the second portion of the passivation layer including a pattern defining a plurality of openings in the second portion of the passivation layer within a peripheral boundary of the pad to expose a plurality of portions of the upper surface of the upper metal layer of the pad, the pattern spanning across the first stack and the second stack, the pattern including the plurality of openings configured to distribute a compressive force on the upper metal layer.

15. A radio-frequency apparatus comprising:
a base wafer having an integrated circuit configured to provide radio-frequency functionality;
a cap wafer implemented over the base wafer; and
a ring structure implemented to join the cap wafer to the base wafer to yield a hermetic cavity, the ring structure including a pad, the pad including a first stack including a first metal layer and a second stack including a second metal layer, the pad further including a polymer layer having a lower surface that forms an interface with the first metal layer of the first stack and the second metal layer of the second stack, and having a wall on a side of the polymer layer, the pad further including an upper metal layer over the polymer layer, the upper metal layer having an upper surface on which to implement a metal ring and having a wall on a side of the upper metal layer, the ring structure further including a passivation layer including first and second portions, the first portion configured to cover the wall of the upper metal layer and to cover the wall of the polymer layer, the first portion extending downward following the shape of the wall of the upper metal layer and the wall of the polymer layer, the second portion implemented over the upper metal layer, the second portion of the passivation layer including a pattern defining a plurality of openings in the second portion the passivation layer within a peripheral boundary of the pad to expose a plurality of portions of the upper surface of the upper metal layer, the pattern spanning across the first stack and the second stack, the pattern including the plurality of openings configured to distribute a compressive force on the upper metal layer, the ring structure further including a metal ring implemented over the pad such that the metal ring is connected to the exposed plurality of portions of the upper surface of the upper metal layer of the pad through the plurality of openings of the second portion of the passivation layer.

16. The radio-frequency apparatus of claim 15 further comprising a device implemented within the hermetic cavity.

17. The radio-frequency apparatus of claim 16 wherein the device is built on, or a part of, the integrated circuit of the base wafer.

18. The radio-frequency apparatus of claim 17 wherein the device is a MEMS device.

19. The radio-frequency apparatus of claim 16 wherein the device is a surface acoustic wave (SAW) device, a bulk acoustic wave (BAW) device, or a film bulk acoustic resonator (FBAR) device.

20. The radio-frequency apparatus of claim 19 wherein the device is a radio-frequency filter.

* * * * *